(12) United States Patent
DiStefano et al.

(10) Patent No.: US 6,635,553 B1
(45) Date of Patent: Oct. 21, 2003

(54) MICROELECTRONIC ASSEMBLIES WITH MULTIPLE LEADS

(75) Inventors: Thomas H. DiStefano, Monte Sereno, CA (US); John W. Smith, Palo Alto, CA (US)

(73) Assignee: Tessera, inc., San Jose, CA (US)

( * ) Notice: Subject to any disclaimer, the term of this patent is extended or adjusted under 35 U.S.C. 154(b) by 74 days.

(21) Appl. No.: 09/721,048

(22) Filed: Nov. 22, 2000

Related U.S. Application Data

(62) Division of application No. 09/372,021, filed on Aug. 9, 1999, now Pat. No. 6,194,291, which is a continuation of application No. 09/138,858, filed on Aug. 24, 1998, now Pat. No. 6,104,087, which is a division of application No. 08/440,665, filed on May 15, 1995, now Pat. No. 5,801,441, which is a division of application No. 08/271,768, filed on Jul. 7, 1994, now Pat. No. 5,518,964.

(51) Int. Cl.[7] ............................................. H01L 21/30
(52) U.S. Cl. ..................... 438/455; 438/461; 438/464; 438/425; 257/696; 257/693; 257/690
(58) Field of Search ................................. 438/455, 461, 438/464, 125; 257/696, 692, 701

(56) References Cited

U.S. PATENT DOCUMENTS

| | | | |
|---|---|---|---|
| 3,373,481 A | 3/1968 | Lins et al. | 29/471.3 |
| 3,795,037 A | 3/1974 | Luttmer | 29/628 |
| 3,811,186 A | 5/1974 | Larnerd et al. | 29/626 |
| 3,825,353 A | 7/1974 | Loro | 317/234 R |
| 3,842,189 A | 10/1974 | Southgate | 174/52 |
| 3,952,404 A | 4/1976 | Matunami | 29/589 |
| 4,067,104 A | 1/1978 | Tracy | 29/626 |
| 4,142,288 A | 3/1979 | Flammer et al. | 29/628 |
| 4,326,663 A | 4/1982 | Oettal | 228/123 |
| 4,447,857 A | 5/1984 | Marks et al. | 361/395 |
| 4,520,562 A | 6/1985 | Sado et al. | 29/878 |

(List continued on next page.)

FOREIGN PATENT DOCUMENTS

| | | |
|---|---|---|
| EP | 0 072 673 A2 | 2/1983 |
| EP | 0 352 020 A3 | 1/1990 |
| EP | 0 433 997 A2 | 6/1991 |
| GB | 2 142 568 A | 1/1985 |
| GB | 2 151 529 A | 7/1985 |
| JP | 61 91939 | 5/1986 |
| JP | 1-155633 | 6/1989 |
| JP | 3-108734 | 5/1991 |
| WO | WO 94/03036 | 2/1994 |

OTHER PUBLICATIONS

"Electronic Packaging and Interconnection Handbook", pp. 7.24–7.25: Harper.

"Method of Testing Chips and Joining Chips to Substrates", Research Disclosure, Feb. 1991, No. 322 Kenneth Mason Publication, Ltd., England.

IBM Technical Disclosure Bulletin, vol. 36, No. 07, Jul. 1993.

*Primary Examiner*—Caridad Everhart
*Assistant Examiner*—Belur V. Keshavan
(74) *Attorney, Agent, or Firm*—Lerner, David, Littenberg, Krumholz & Mentlik, LLP

(57) ABSTRACT

A microelectronic connection component includes a support such as a dielectric sheet having elongated leads extending along a surface. The leads have terminal ends permanently connected to the support and tip ends releasably connected to the support. The support is juxtaposed with a further element such as a semiconductor chip or wafer, and tip ends of the leads are bonded to contacts on the wafer using a bonding tool advanced through holes in the support. After bonding, the support and the further element are moved away from one another so as to deform the leads.

19 Claims, 11 Drawing Sheets

U.S. PATENT DOCUMENTS

| | | | |
|---|---|---|---|
| 4,629,957 A | 12/1986 | Walters et al. | 318/662 |
| 4,661,192 A | 4/1987 | McShane | 156/292 |
| 4,667,219 A | 5/1987 | Lee et al. | 357/68 |
| 4,721,995 A | 1/1988 | Tanizawa | 357/80 |
| 4,751,199 A | 6/1988 | Phy | 437/209 |
| 4,785,137 A | 11/1988 | Samuels | 174/52 |
| 4,793,814 A | 12/1988 | Zifcak et al. | 439/66 |
| 4,812,191 A | 3/1989 | Ho et al. | 156/239 |
| 4,893,172 A | 1/1990 | Matsumoto et al. | 357/79 |
| 4,926,241 A | 5/1990 | Carey | 357/75 |
| 4,937,653 A | 6/1990 | Blonder et al. | 357/68 |
| 4,949,158 A | 8/1990 | Ueda | 357/68 |
| 4,954,877 A | 9/1990 | Nakanishi et al. | 357/80 |
| 4,955,523 A | 9/1990 | Calomagno et al. | 228/179 |
| 5,047,830 A | 9/1991 | Grabbe | 357/68 |
| 5,049,085 A | 9/1991 | Reylek et al. | 439/91 |
| 5,055,907 A | 10/1991 | Jacobs | 357/71 |
| 5,057,460 A | 10/1991 | Rose | 437/217 |
| 5,067,007 A | 11/1991 | Otsuka et al. | 357/74 |
| 5,131,852 A | 7/1992 | Grabbe et al. | 439/71 |
| 5,152,695 A | 10/1992 | Grabbe et al. | 439/71 |
| 5,166,099 A | 11/1992 | Ueda et al. | 437/220 |
| 5,192,716 A | 3/1993 | Jacobs | 437/209 |
| 5,197,892 A | 3/1993 | Yoshizawa et al. | 439/91 |
| 5,210,939 A | 5/1993 | Mallik et al. | 29/840 |
| 5,230,931 A | 7/1993 | Yamazaki et al. | 427/569 |
| 5,254,811 A | 10/1993 | Ludden et al. | 174/268 |
| 5,286,680 A | 2/1994 | Cain | 437/216 |
| 5,346,861 A | 9/1994 | Khandros et al. | 437/209 |
| 5,430,614 A | 7/1995 | Difrancesco | 361/785 |
| 5,455,390 A | 10/1995 | DiStefano et al. | 174/262 |
| RE35,119 E | 12/1995 | Blonder et al. | 257/739 |
| 5,518,964 A | 5/1996 | DiStefano et al. | 437/209 |
| 5,528,083 A | 6/1996 | Malladi et al. | 257/786 |
| 5,801,441 A | 9/1998 | DiStefano et al. | 257/696 |
| 5,865,365 A | 2/1999 | Nishikawa et al. | 228/223 |
| 6,104,087 A | 8/2000 | DiStefano et al. | 257/696 |

MICROELECTRONIC ASSEMBLIES WITH MULTIPLE LEADS

CROSS-REFERENCE TO RELATED APPLICATIONS

The present application is a divisional of U.S. patent application Ser. No. 09/372,021 now U.S. Pat. No. 6,194,291, filed Aug. 9, 1999, which in turn is a continuation of U.S. patent application Ser. No. 09/138,858, filed Aug. 24, 1998, now U.S. Pat. No. 6,104,087, which in turn is a divisional of U.S. patent application Ser. No. 08/440,665 filed May 15, 1995, now U.S. Pat. No. 5,801,441, which is in turn a divisional of U.S. patent application Ser. No. 08/271,768, filed on Jul. 7, 1994, now U.S. Pat. No. 5,518,964.

FIELD OF THE INVENTION

The present invention relates to mounting and connection devices and techniques for use with microelectronic elements such as semiconductor chips.

BACKGROUND OF THE INVENTION

Complex microelectronic devices such as modern semiconductor chips require numerous connections to other electronic components. For example, a complex microprocessor chip may require many hundreds of connections to external devices.

Semiconductor chips commonly have been connected to electrical traces on mounting substrates by one of three methods: wire bonding, tape automated bonding, and flip-chip bonding. In wire bonding, the chip is positioned on a substrate with a bottom or back surface of the chip abutting the substrate and with the contact-bearing front or top surface of the chip facing upwardly, away from the substrate. Individual gold or aluminum wires are connected between the contacts on the chip and pads on the substrate. In tape automated bonding a flexible dielectric tape with a prefabricated array of leads thereon is positioned over the chip and substrate and the individual leads are bonded to the contacts on the chip and to pads on the substrate. In both wire bonding and conventional tape automated bonding, the pads on the substrate are arranged outside of the area covered by the chip, so that the wires or leads fan out from the chip to the surrounding pads. The area covered by the subassembly as a whole is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with chips having contacts disposed in rows extending along the periphery of the chip. They generally do not lend themselves to use with chips having contacts disposed in a so-called area array, i.e., a grid-like pattern covering all or a substantial portion of the chip front surface.

In the flip-chip mounting technique, the contact bearing surface of the chip faces towards the substrate. Each contact on the chip is joined by a solder bond to the corresponding pad on the substrate, as by positioning solder balls on the substrate or chip, juxtaposing the chip with the substrate in the front-face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the chip contacts and substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

Numerous attempts have been made to solve the foregoing problem. Useful solutions are disclosed in commonly assigned U.S. Pat. Nos. 5,148,265 and 5,148,266. Preferred embodiments of the structures disclosed in these patents incorporate flexible, sheet-like structures referred to as "interposers" or "chip carriers". The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the chip contacts, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the chip without imposing significant stresses on the bonds between the leads and the chip, or on the bonds between the terminals and the substrate. Thus, the assembly can compensate for thermal effects. Moreover, the assembly most preferably includes a compliant layer disposed between the terminals on the chip carrier and the face of the chip itself as, for example, an elastomeric layer incorporated in the chip carrier and disposed between the dielectric layer of the chip carrier and the chip. Such a compliant structure permits displacement of the individual terminals independently towards the chip. This permits effective engagement between the subassembly and a test fixture. Thus, a test fixture incorporating numerous electrical contacts can be engaged with all of the terminals in the subassembly despite minor variations in the height of the terminals. The subassembly can be tested before it is bonded to a substrate so as to provide a tested, known, good part to the substrate assembly operation. This in turn provides very substantial economic and quality advantages.

Co-pending, commonly assigned U.S. patent application Ser. No. 08/190,779 describes a further improvement. Components according to preferred embodiments of the '779 application use a flexible, dielectric top sheet having top and bottom surfaces. A plurality of terminals are mounted on the top sheet. A support layer is disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials as, for example, eutectic bonding metals. The support layer surrounds and supports the leads.

Components of this type can be connected to microelectronic elements such as semiconductor chips or wafers by juxtaposing the bottom surface of the support layer with the contact-bearing surface of the chip so as to bring the lower ends of the leads into engagement with the contacts on the chip, and then subjecting the assembly to elevated temperature and pressure conditions. All of the lower ends of the leads bond to the contacts on the chip substantially simultaneously. The bonded leads connect the terminals of the top sheet with the contacts on the chip. The support layer desirably is either formed from a relatively low-modulus, compliant material, or else is removed and replaced after the lead bonding step with such a compliant material. In the finished assembly, the terminals desirably are movable with respect to the chip to permit testing and to compensate for thermal effects. However, the components and methods of the '779 application provide further advantages, including the ability to make all of the bonds to the chip or other component in a single lamination-like process step. The components and methods of the '779 application are especially advantageous when used with chips or other microelectronic elements having contacts disposed in an area array.

Despite these and other advances in the art, there are still needs for further improvements.

SUMMARY OF THE INVENTION

One aspect of the present invention provides methods of making microelectronic lead arrays. Method according to this aspect of the present invention includes the steps of providing a first element having a first surface with a plurality of elongated, flexible leads extending along the first surface, each such lead having a terminal end attached to the first element and a tip end offset from the terminal end in a preselected, first horizontal direction parallel to the first surface. The method also includes the step of simultaneously forming all of the leads by moving all of the tip ends of the leads relative to the terminal ends thereof and relative to the first element so as to bend the tip ends away from the first element.

Desirably, the tip ends of all the leads are attached to a second element, and the step of moving the tip ends of the lead relative to the terminal ends of the leads includes the step of moving the second element relative to the first element. Thus, the second element may be moved, relative to the first element, in a second horizontal direction opposite to the first horizontal direction, i.e., opposite to the terminal end to tip end direction of the leads. The second element preferably also moves in a downward vertical direction, away from the first element, simultaneously with the horizontal movement. The net effect is to move the tip end of each lead horizontally towards its own terminal end and vertically away from the terminal end, thereby deforming the leads towards formed positions in which the leads extend generally vertically downwardly, away from the first element. Methods according to this aspect of the present invention preferably also include the step of injecting a flowable, desirably compliant dielectric material around the leads after the lead-forming step and then curing the flowable material so as to form a dielectric support layer around the leads.

Most preferably, the first element is a flexible, dielectric top sheet having terminal structures extending therethrough at the terminal ends of the leads. The forming process may be used to produce a component for subsequent attachment to a microelectronic element. In processes for making such a component, the second element may be a temporary, removable element as, for example, a sheet of a soluble polymer. This temporary element is removed after the support layer is formed, as by dissolving away the soluble sheet, leaving the tip ends of the leads exposed at the bottom surface of the support layer. Bonding material can be applied to the tip ends of the leads before or after the step of forming the dielectric support layer. The resulting component can be assembled to a chip or other microelectronic element by juxtaposing the exposed surface of the support layer with the contact bearing surface of the element and bonding the tip ends of the leads to the contacts of the chip or other element.

Thus, after the component is connected to the chip or other element, the terminals on the flexible sheet are electrically connected to the contacts of the chip, but are movable with respect to the contacts both in directions parallel to the surface of the chip and towards the surface of the chip. The resulting assembly can be tested readily by engagement with a test probe and can also be assembled readily to a larger substrate. The movability of the terminals will provide compensation for differences in thermal expansion and contraction of the chip and the substrate to which it is mounted.

In a variant of this approach, the second element is a permanent, flexible dielectric sheet, initially positioned adjacent the first sheet. The tip end of each lead is provided with a conductive tip structure, such as a conductive post or via extending through the second dielectric sheet. In the lead-forming step, the second sheet moves away from the first sheet, and the flowable dielectric material is injected between the sheets. The tip structures may be provided with conductive bonding materials, and the resulting component may be connected to a microelectronic element by juxtaposing the surface of the second sheet with the contact-bearing surface of the microelectronic element.

According to a further, and particularly preferred arrangement, the second element is itself a microelectronic element such as a semiconductor chip or wafer. In this arrangement, the step of attaching the tip ends of the leads to the second element includes the step of bonding the tip ends of the leads to the contacts on the chip or other microelectronic element. This step desirably is performed while the leads are in their initial, undeformed positions. Thus, all of the tip ends are bonded simultaneously to all of the contacts on the microelectronic element. Because the leads are in their initial, undeformed positions when bonded to the contacts, the tip positions of the lead tips are well controlled at this stage. This facilitates registration of the lead tips with the contacts. Further, the process lends itself to application of substantial forces between the lead tips and the contacts.

In a particularly preferred arrangement, the second element is a multi-chip unit such as a wafer incorporating a plurality of semiconductor chips having contacts thereon and the first element or sheet extends over a plurality of these chips so that the sheet includes a plurality of regions, one such region corresponding to each such chip. In this arrangement, the step of attaching the tip ends of the leads to the second element preferably includes the step of bonding the tip ends of leads in a plurality of such regions, and desirably in all of such regions, to the contacts on the corresponding chips simultaneously so that each such region is connected to one chip. The method further includes the step of severing the chips from the multichip element or wafer and severing the regions from the sheet so as to form individual units, each including one chip and the associated region of the sheet. Preferably, the method also includes the step of injecting a flowable dielectric material between the wafer and the sheet and curing the dielectric material to form a compliant dielectric support layer after the lead bonding step but before the severing step. The severing step thus includes the step of severing the dielectric support layer so that each unit formed in the severing step will include a portion of the dielectric support layer. Alternatively, the multi-chip unit may include an assembly of chips in the desired configuration for use, such as an assembly of chips mounted to a common heat sink or support, and the first element may include circuitry adapted to interconnect the plural chips. In this variant, the chips are not severed from one another.

Most preferably, the step of bonding the tip ends of the leads to the contacts of the microelectronic element includes the steps of aligning the top sheet or first element with the microelectronic element so that the tips are in registration with the contacts and biasing the sheet towards the microelectronic element while maintaining the registration. Thus, the sheet may be in engagement with a reinforcing structure during the bonding step to aid registration. The reinforcing structure may include a flexible but substantially inextensible foil such as a metallic foil bonded to the sheet. Alternatively or additionally, the reinforcing structure may include a substantially rigid ring having a central opening such that the sheet extends across the central opening and is held taut by the ring. The step of biasing the sheet towards the contact bearing surface may include the step of applying fluid pressure, such as air pressure, to the top surface of the sheet either directly or through a diaphragm or bag so as to maintain uniform pressure over the entire surface of the sheet.

A further aspect of the present invention provides a component for making a microelectronic connection including a first dielectric element having a first or bottom surface and a plurality of elongated flexible leads overlying the first surface of the first element. Each such lead has a terminal end secured to the first element and a tip end movable away from the first element, the tip end of each such lead being offset from the terminal end of the lead in a first horizontal direction parallel to the first surface. Preferably, the dielectric first element is a sheet having a top or second surface opposite from the first surface, and the component also includes electrically conductive terminal structures extending through the sheet at the terminal ends of the leads. Preferably, each lead has an electrically conductive bonding material at the tip end. Thus, the leads may include gold and the bonding material may include a metal selected to form a low-melting eutectic with gold, such as a metal selected from a group consisting of tin, germanium and silicon. The leads desirably are arranged in a regular, grid-like pattern at spacing intervals of less than about 1.25 mm between corresponding features of adjacent leads. Desirably, each lead is between about 200 and about 1000 microns long, about 10 microns to about 25 microns thick and about 10 microns to about 50 microns wide. Components according to this aspect of the invention can be used in methods as discussed above.

Yet another aspect of the invention provides a microelectronic connector including a body such as a flexible dielectric sheet having a bottom surface, there being an area array of terminal structures mounted to the body and exposed on the bottom surface thereof. The connector according to this aspect of the invention includes a plurality of leads, each said lead extending away from said bottom surface, each said lead having a terminal end connected to one said terminal structure and a tip end remote from the terminal structure. The connector according to this aspect of the invention further includes a layer of a compliant dielectric material on said bottom surface of said body, said compliant layer having a bottom surface remote from said body. The compliant layer substantially surrounds and support the leads. The tip ends of the leads protrude from the bottom surface of the compliant layer. Thus, the tip ends of the leads can be engaged with contacts on a microelectronic element by juxtaposing the contact-bearing surface of the microelectronic element with the bottom surface of the compliant layer. Each lead desirably has an electrically conductive bonding material at its tip end for joining the tip end to a contact.

The leads may be generally S-shaped. Each lead may be formed from a ribbon of conductive material having oppositely-directed major surfaces, the ribbon being curved in directions normal to its major surfaces to form the S-shape or other curved configuration of the lead.

Yet another aspect of the invention provides a microelectronic assembly incorporating a microelectronic element having a front surface with an area array of contacts thereon. The assembly includes a connector body having a bottom surface facing toward said front surface of said element but spaced therefrom. The connector body has an area array of terminal structures exposed on said bottom surface and overlying the array of contacts on the microelectronic element.

The assembly includes curved, preferably S-shaped flexible leads extending between the terminal structures and contacts. Here again, each flexible lead desirably is constituted by a metallic ribbon having oppositely-directed major surfaces, the ribbon being curved in directions normal to its major surfaces to form the S-shape.

Assemblies and connectors according to the last-said aspects of the invention can be fabricated readily by the preferred processes discussed above. Preferred assemblies and connectors according the these aspects of the invention provide compact, reliable connections for semiconductor chips and similar elements.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
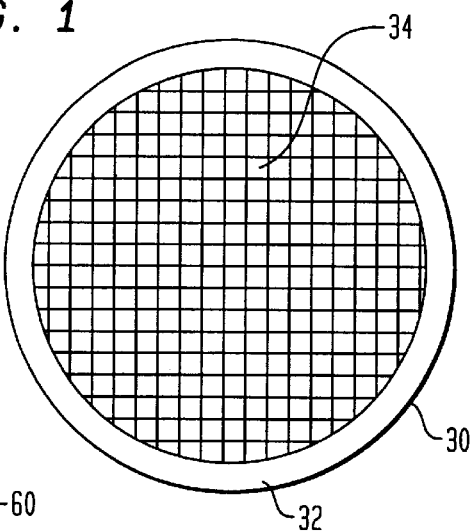
FIG. 1 is a plan view of elements used in manufacture of a component according to one embodiment of the invention.
Figure 2:
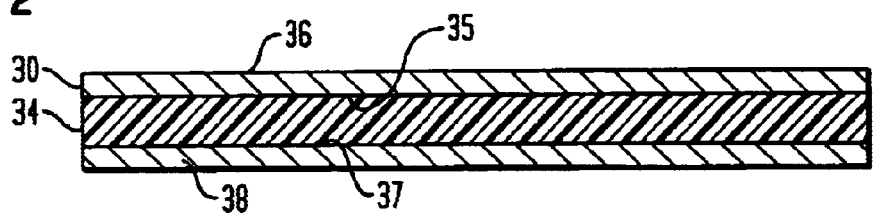
FIG. 2 is a fragmentary schematic sectional view, on an enlarged scale, of one element depicted in FIG. 1.

A process for manufacturing components according to one embodiment of the invention begins with a starting multilayer sheet 30. Multilayer sheet 30 includes a dielectric sheet 34 (FIG. 2), preferably formed from a polymer such polyimide or other known dimensionally stable polymeric films used in the semiconductor industry. Dielectric sheet 34 desirably is less than about 40 microns thick, more preferably between about 20 and about 30 microns thick and most preferably about 25 microns thick. A top layer 36 of electrolytically deposited copper covers the top surface 35 of dielectric sheet 34, whereas a similar bottom layer 38 covers the opposite, bottom surface 37 of the dielectric sheet. The copper layers may be about 5 to about 25 microns thick. In the starting condition illustrated in FIGS. 1 and 2, these layers are continuous and substantially uniform over the entire extent of mutilator sheet 30. The multilayer sheet is stretched taut. While the multilayer sheet is maintained in a taut condition, it is bonded to a ring-like, generally circular frame 32 so that the multilayer sheet 30 stretches across the central opening of the frame. The multilayer sheet is bonded to the frame using a suitable high temperature adhesive such as an epoxy resin film, preferably on the order of about 10 microns thick. Frame 32 is formed from a substantially rigid material having a coefficient of thermal expansion substantially equal to that of the semiconductor part with which the assemblage will be used in later steps. Typically, the semiconductor parts are formed from silicon, and hence the frame has a thermal coefficient of expansion substantially equal to that of silicon. Molybdenum is the preferred frame material.

Figure 3:
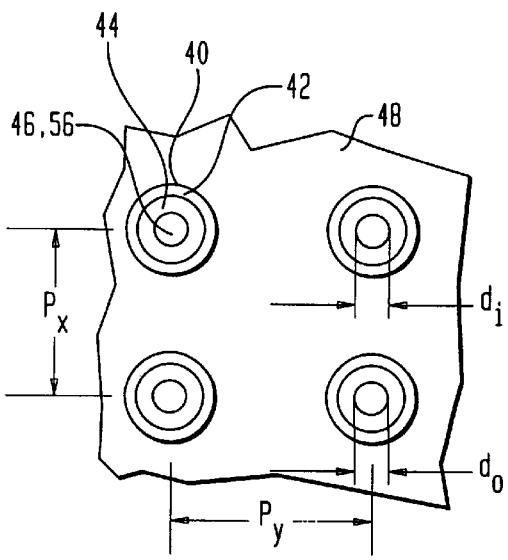
FIG. 3 is a fragmentary top plan view depicting portions of the element of FIG. 2 but at a later stage in manufacture.
Figure 12:
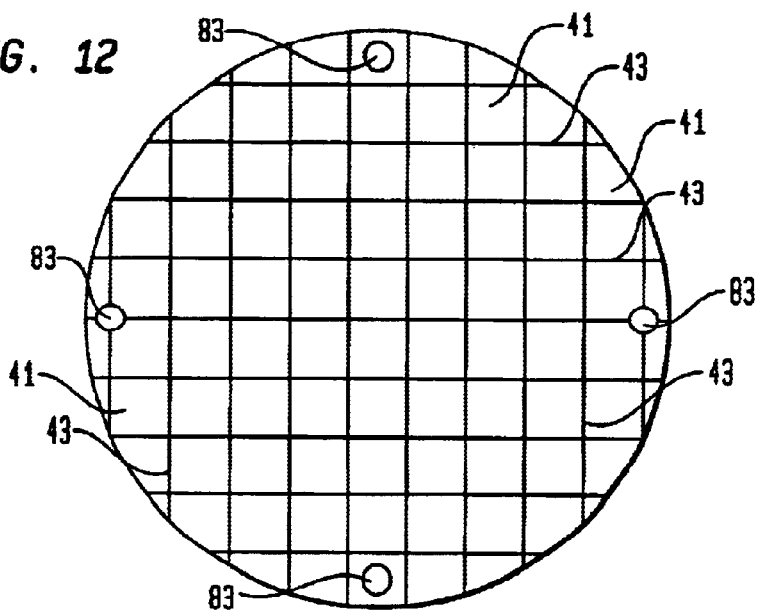
FIG. 12 is a top plan view depicting a partially completed assembly after the process of FIG. 11.

In the next stage of the process, bottom layer 38 is completely masked by bottom resist 50 whereas top layer 36 is selectively masked in a pattern as shown in FIG. 3. The selective masking can be performed by a conventional technique of applying an electrophoretic resist, selectively exposing the areas to be covered by the resistor and heat curing and developing the resist to remove the uncured resist material. One suitable resist is sold under the designation "Eagle Electrophoretic Resist" by the Shippley Company of Wellesley, Mass. A developer for this resist is available from the same source. The pattern includes a vast number of terminal-forming regions 40, typically tens or hundreds of thousands, arranged in a substantially regular pattern including one or more regular, rectilinear grids having a constant pitch $P_x$ in one direction and a constant, pitch $P_y$ in the other direction along the surface of the sheet. Typically, Py is equal to PX. As further discussed below, various regions of the sheet will ultimately be associated with individual chips in a wafer. The grids within each such region may be continuous with one another, or else may be separated from one another by spaces or interruptions in the grid pattern. The regions 41 are schematically depicted in FIG. 12 as separated from one another by visible borders 43. However, such visible borders are not always present. Each terminal-forming region 40 includes an annular mask region 42 defining the periphery of a ring 44 and a central mask region 46 defining a central hole within the ring. The rings 44 are unmasked. The remainder of the sheet is also unmasked so as to form a substantially continuous unmasked region 48 surrounding each of the terminal forming regions 40 and isolated from the ring 44 of each such region by the annular mask region 42 thereof. Continuous unmasked region 48 desirably extends over most or all of the entire sheet. At predetermined locations within the array, the terminal forming region has a modified configuration (not shown) in which the annular mask region 42 is interrupted or eliminated so as to leave the ring 44 connected to the continuous region 48. As further discussed below, these modified terminal forming regions will form potential plane terminals.

Figure 4:
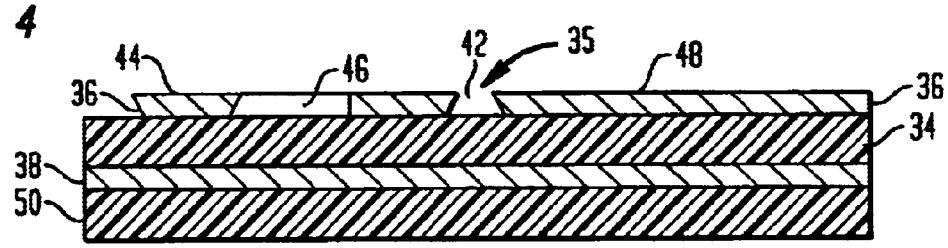
FIGS. 4 through 7 are further fragmentary schematic sectional views similar to FIG. 2 but at progressively later stages during its manufacture.
Figure 5:
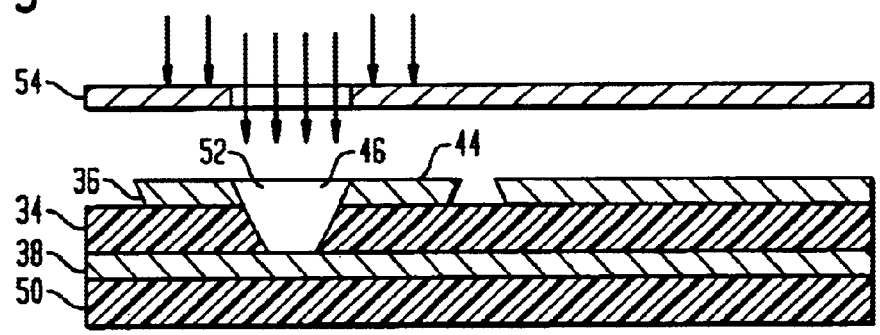
Figure 6:
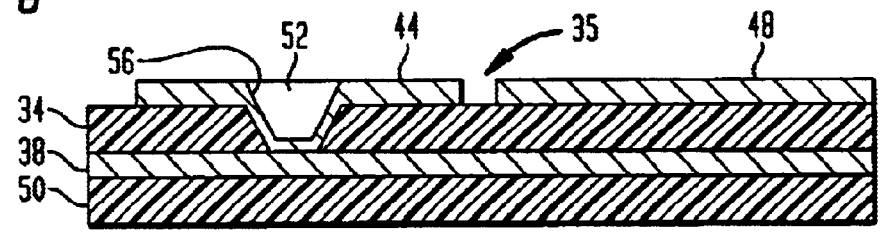
Figure 7:
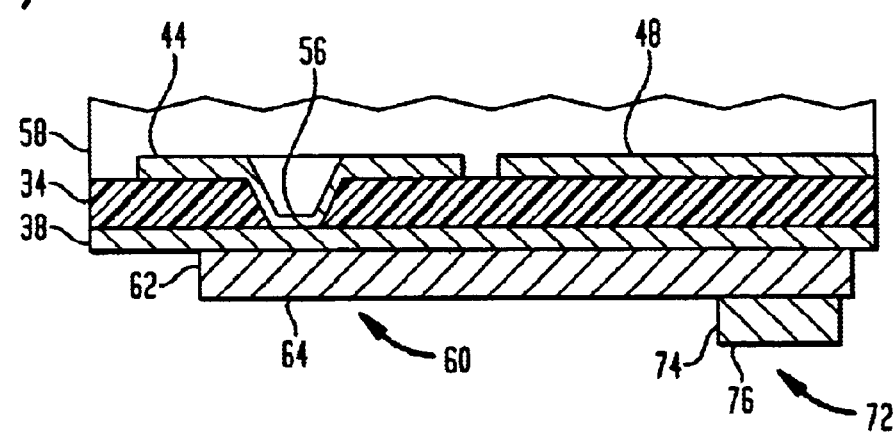
Figure 9:
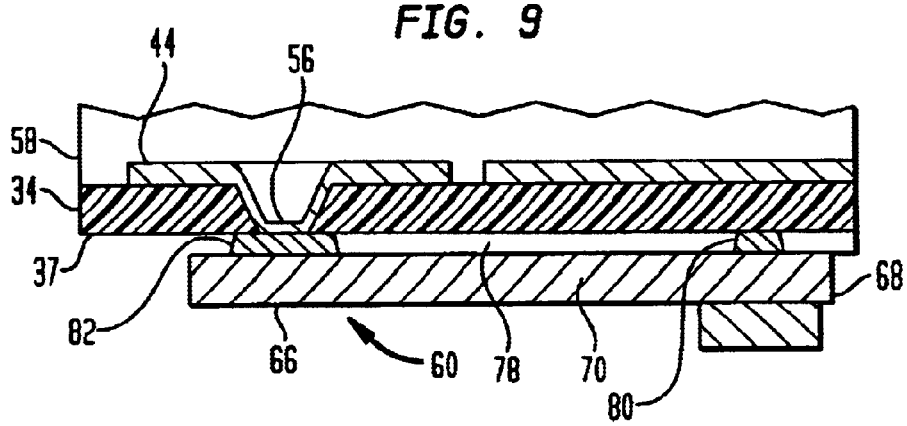
FIGS. 9 and 10 are further views similar to FIG. 2, depicting the elements at later stages of manufacture.

After the selective masking has been applied, the assembly is electroplated with an etch resistant metal such as a metal selected from the group consisting of nickel, gold and palladium, most preferably nickel. This plating may be about 1 to 3 microns thick, most preferably about 2 microns thick. The plated metal thus covers the ring 44 of each terminal-forming region 40 and also covers the continuous area 48. The resist is then stripped away using conventional resist removal techniques, leaving the top copper layer 36 exposed in annular areas 42 and center holes areas 46. The assembly is then subjected to etching using a conventional copper etching solution such as a CuCl etch. During this etching procedure, the etch resistant metal such as nickel previously deposited acts as a resist or etch stop, and protects copper layer 36. However, in center hole areas 46 and annular areas 42, the etch resistant metal is not present and the copper layer is removed, leaving a pattern as illustrated in FIG. 4, with continuous area 48 and ring areas 44 having copper and nickel and with the center hole areas 46 and annular areas 42 etched to expose the top surface 35 of the dielectric film 34. During this procedure, the bottom copper layer 38 is protected by a bottom resist 50.

In the next stage of the process, holes 52 are formed in dielectric film 34 within the center hole region 46 of each terminal region. The holes are formed by ablation using radiant energy such as excimer laser light, desirably at 308 nm wavelength. A mask 54 with holes corresponding to the central holes 46 of the terminal regions is placed above the assemblage so that the holes in the mask are in registration with the central holes 46, and the radiant energy is directed through the holes of the mask. The mask is formed from a heat resistant material such as molybdenum. The mask absorbs most of the radiation. However, the copper and nickel rings 44 surrounding central holes 46 also act as masks, and limit ablation of the dielectric sheet to the regions within central holes 46.

In the next step of the process, the holes or vias 52 are lined with a layer of via liner 56 of copper using an electroless plating process. The electroless plating process may include seeding or pretreatment with a palladium salt or other deposition promoter, followed by exposure to the electroless plating solution itself. The copper layer 56 extends over the bottom of each hole 52, in contact with the bottom copper layer 38 and also extends over the top or upwardly facing surface of each ring 44. Thus, the copper forms a blind via liner connecting each ring 44 with the bottom copper layer 38. Desirably, the copper layer is about 10 microns thick. The bottom resist 50 remains in place during this process, and hence the copper is not deposited on the surface of bottom copper layer 38 facing away from sheet 34. At this stage of the process, the top surface has a plurality of ring-like terminal structures 44 on its top surface 35 and a blind via liner 56 extending through the dielectric sheet at the center of each such ring-like terminal structure. A substantially continuous electrically conductive copper potential plane 48 extends over the top surface of the sheet. Each ring-like terminal structure 44 is surrounded by this continuous layer 48 but electrically isolated therefrom by an annular region 42 (FIG. 3) substantially devoid of conductive material. However, the potential plane terminals (not shown) formed with the modified structure mentioned above have their ring-like terminal structures 44 electrically connected to continuous layer 48. The copper features on the top surface are then electroplated to a thickness of about 2 microns with nickel. The plating current is applied through bottom copper layer 38, and-transmitted to the terminals 44 by the via liners 56. The plating current is applied to the potential plane through the potential plane terminals. A layer of gold, desirably about 0.5 microns thick, is electroplated over the nickel layer. The nickel and gold layers form protective, corrosion-resistant coverings on the copper surfaces and edges.

In the next stage of the process, bottom resist 50 is removed and a top resist 58 is applied over the entire top surface of the dielectric sheet 34, and hence over the ring structures 44 and continuous conductive region 48. The exposed bottom surface of the bottom copper layer 38 is patterned using a resist, photo exposure, curing and developing process similar to those discussed above so as to leave an array of generally dumbbell-shaped lead regions uncovered, and leaving the remainder of the bottom layer 38 covered by the resist. Individual leads 60 are formed in each region by electroplating a nickel layer 62, typically about 2 microns thick on bottom copper layer 38 and then electroplating a gold layer 64, typically about 5 to about 25 microns thick, desirably about 20 microns thick, on the nickel layer. The resist used to form leads 60 is then removed.

Each lead 60 includes a generally circular, terminal end bulge 66 (FIG. 8), a somewhat smaller, generally circular tip end bulge 68 and an elongated, relatively narrow strip 70 extending between these bulges. Leads 60 are disposed in a regular, rectilinear grid having the same pitch and arrangement as the grid of ring-like terminals 44 on the top surface. Thus, each circular bulge 66 is concentric with one terminal 44 on the top surface and with the associated via 56. In the next stage of the process, an electrically conductive bonding material is applied in spots 72 on the exposed surfaces on tip end regions 68 of the leads. One suitable bonding material includes a layer of tin 74, desirably about 10 microns thick and a gold antioxidant layer 76, desirably about 2 microns thick over the tin layer. Once again, a resist is coated over the exposed surfaces of the leads and photographically patterned and developed to provide holes in the resist at the desired spots for the bonding material. The electrically conductive bonding material in each spot 72 is applied by electroplating. As discussed further below, other bonding materials and deposition processes may also be employed.

In the next stage of the process, the top resist 58 is left in place and the bottom copper layer 38 is exposed to a sub-etching process using a CuCl etch solution. The gold layer 64 and nickel layer 62 are substantially unaffected by the etchant and act as etching masks. Bottom copper layer 38 is attacked in the exposed areas and also at the edges of the leads 60, i.e., at the edges of the gold and nickel layers. As the process proceeds, the copper layer is removed in the exposed areas and progressively removed beneath the leads 60. The extent of inward removal or undercutting from each edge of lead 60 increases progressively with time. The process time is selected so that undercut regions starting from opposite edges of each strip 70 merge with one another, leaving each strip 70 separated from the dielectric sheet 34 by a gap 78. However, because the diameter $D_{tip}$ of each tip end bulge 68 is larger than the width WS of strips 70, the etching or undercutting of the copper layer does not proceed all the way to the center of each tip end bulge 68. Rather, the etching process stops short of the center leaving a small, copper button 80 extending from the tip end bulge 68 to the bottom surface 37 of dielectric sheet 34. Button 80 desirably has a diameter substantially smaller than the diameter of tip end bulge 68. Desirably, the button diameter is less than about 50 microns, and hence the surface area of the button in contact with the lower surface 37 of the dielectric sheet 34 is very small. As the adhesion is directly related to the surface area of contact, the adhesion is only strong enough to retain the tip end of the lead against gravitational and acceleration forces in normal, gentle handling. The bond between the button 80 and the dielectric sheet can be broken readily in the process discussed below.

The etching process also undercuts inwardly from the periphery of each terminal in bulge 66 so as to form a substantially circular terminal end button 82 concentric with the terminal end bulge 66 of each lead. Each terminal end button 82 is also concentric with the associated via 56, and is metallurgically bonded to the via lining. The terminal end buttons 82 are also metallurgically bonded to the terminal end bulges 66 of the leads. Thus, each lead is provided with an electrically continuous, unitary, metallurgically bonded terminal end structure including the terminal end bulge 66, button 82, via liner 56 and ring-like terminal 44 extending through the dielectric sheet from the terminal end 66 of the lead to the top surface of the dielectric sheet. Each such terminal end structure firmly secures the terminal end 66 of the lead in place. Following these stages, the top resist 58 is removed and all of the metallic components, including the terminals or rings 44, via liners 56 and leads 60 are electrolessly plated with a thin covering of gold, desirably about 1 micron thick. This electroless gold layer coats all of the exposed metal surfaces and edges, including the edges and surfaces exposed by etching bottom copper layer 38.

The plating and etching steps used to form the other features also form fiducial marks including transparent metal free regions 83 schematically indicated in FIG. 12.

At this stage of the process, the component is complete. The dielectric sheet is still secured within frame 32 (FIG. 1), and the dielectric sheet 34 remains in a taut condition. Dielectric sheet 34 now constitutes a dielectric connector body. The component may be handled, shipped and stored in this condition, or else may be assembled immediately to a microelectronic element. The precise dimensions of the features in the component will depend upon the microelectronic element with which the component will be used. However, for presently popular contact pitch schemes, the following dimensions in Table I can be used (all dimensions in microns).

TABLE I

| | | | | |
|---|---|---|---|---|
| Pitch (P$_x$, P$_y$) | 1000 | 500 | 300 | 200 |
| Inner diameter of ringlike terminals 44 (d$_i$) | 100 | 100 | 75 | 50 |
| Outer Diameter (d$_o$) of terminals | 250 | 250 | 150 | 100 |
| Thickness of Top Copper Layer 36 | 10 | 10 | 5 | 5 |
| Diameter of Terminal End Bulge 66 | 150 | 150 | 125 | 100 |
| Thickness of Bottom Copper Layer 38 | 15 | 10 | 5 | 5 |
| Diameter of Tip End Bulge 68 (D$_{tip}$) | 100 | 100 | 75 | 50 |
| Length (L$_1$) (Center of terminal end bulge 66 to center of tip end bulge 68) | 1000 | 750 | 500 | 300 |
| Width of Strip 70 (W$_s$) | 35 | 25 | 20 | 15 |

Figure 11:
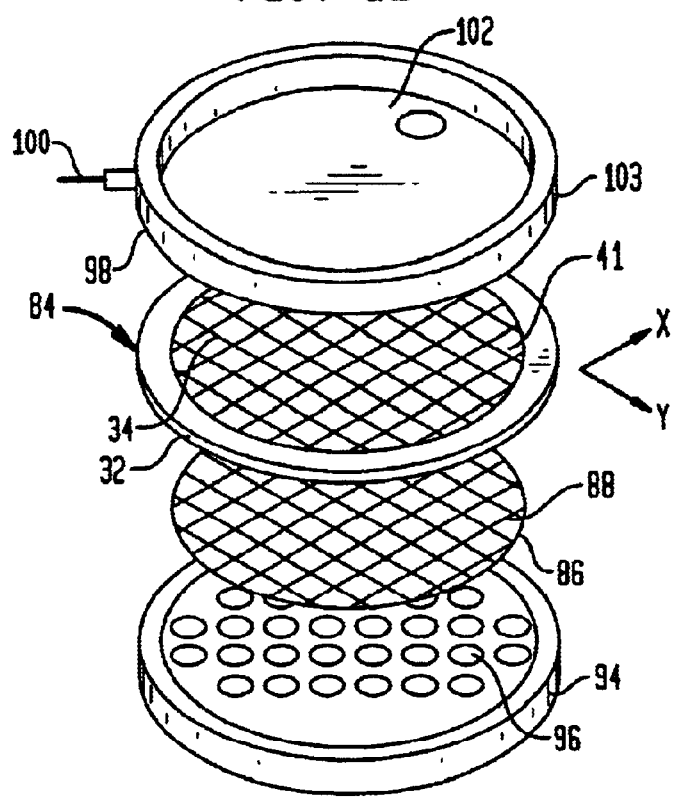
FIG. 11 is a diagrammatic exploded view depicting the component of FIGS. 1–10 together with additional components and apparatus used in an assembly process according to a further embodiment of the invention.
Figure 13:
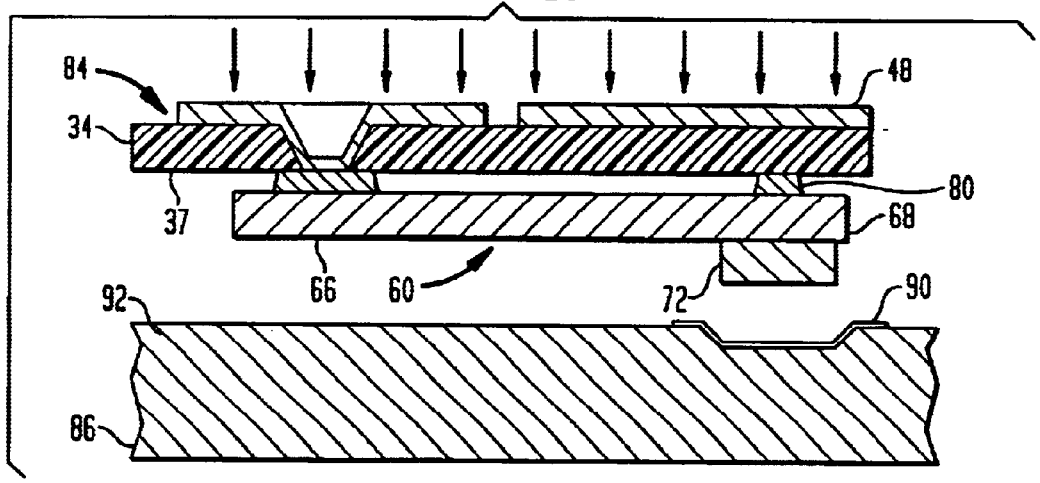
FIGS. 13 through 17 are fragmentary sectional views similar to FIG. 10 but depicting the component together with a semiconductor chip at progressively later stages of the assembly process.

In an attachment process according to a further embodiment of the invention, the completed component 84 made as discussed above, including the frame 32 and dielectric sheet or connector body 34 with the leads and terminals thereon is assembled with a semiconductor wafer 86 (FIG. 11). The wafer includes a large number of individual chip regions 88, each including the elements of a complete semiconductor chip. The individual chip regions correspond to the regions 41 of the component 84 (FIG. 12). Wafer 86 also has a vast number of contacts 90 on the top surface 92 of the chip (FIG. 13). Component 84 is disposed above the top surface of the wafer so that the lower surface 37 of the dielectric sheet 34 faces downwardly, towards the top surface of the chip. A perforated, chip engaging vacuum platen 94 is disposed beneath the wafer 86, and the wafer is held to the platen by vacuum applied through ports 96.

Component 84 is likewise held in engagement with a top platen 98. Top platen 98 includes a transparent plate 102, preferably formed from quartz, surrounded by a metal ring 103. The connecting component is sealingly engaged with top platen, as by an O-ring (not shown) engaged between the circular frame 32 of the connecting component 84 and ring 103. Vacuum is applied through a port 100 to the space between the component and transparent plate 102, thus engaging the flexible sheet firmly with the transparent plate.

While the connecting component 84 and the wafer 86 are engaged with the top and bottom platens, the connection component 84 is brought into registration with the wafer 86 by moving one or both of platens 98 and 94 in the horizontal or X-Y directions and also by rotating one of the platens about a vertical axis, so as to swing the component 84 and wafer 86 relative to one another in the azumithal directions indicated by the arrow theta in FIG. 11. These motions can be controlled using micrometer screw adjusting devices (not shown). During this process, the position of component 84 relative to the chip can be gauged by observing fiducial marks 83 on component 84. Inasmuch as the dielectric film 34 of the component is transparent, the top surface of chip 88 can be seen through plate 102 and through the film 34. Thus, the fiducial marks and the relative positions of the component and chip can be detected either by a human observer or by a machine-vision system.

Figure 10:
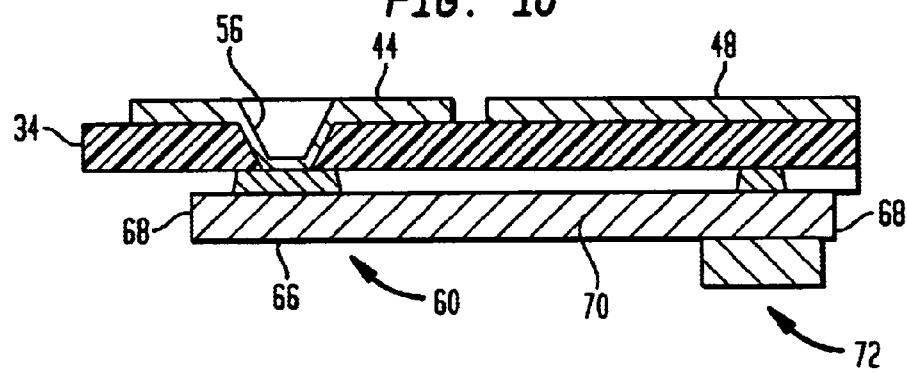

The component 84 is precisely aligned with the chip so that the tip end 68 of each lead 60 is aligned with the correct contact 90 on the wafer. This precise alignment can be achieved even over a relatively large component, covering essentially the entire chip. For example, the chip and component may be about 10–30 cm in diameter. Even over this large area, however, the tip ends of the leads may be aligned with the contacts with the required precision. Several factors contribute to such precise alignment. Because the dielectric film 34 is continuously held taut throughout the lead-forming process and the aligning process by the same frame 32, the leads remain in position. Also, the tip ends 68 of the leads are secured to the film by buttons 80 (FIG. 10) at all times from the time the leads are formed up to and including the alignment process. Therefore, the tip ends cannot move relative to the film. Moreover, because frame 32 has a coefficient of thermal expansion close to that of the wafer, variations in temperature during the alignment process, and during subsequent steps discussed below, will not tend to move the film relative to the wafer. Also, because the fiducial marks 83 are made in the same etching and plating processes as used to form the other elements of the component, the fiducial marks are in precise registration with the leads.

While the component and chip are maintained in precise alignment, the platens are moved toward one another to juxtapose the connecting component closely with the wafer. Compressed gas is admitted between plate 102 of the top platen and connecting component 84 so that the compressed gas bears on the top surface of sheet 34 as depicted by the arrows in FIG. 13. This biases the sheet downwardly towards the wafer so that the bonding material 72 at the tip end of each lead is engaged with the aligned contact 90. The pressurized gas achieves intimate contact between the component 84, and particularly the bonding material 72 at the tip ends of the leads, over the entire surface of the wafer despite any non-planarity of the component or of the wafer, without applying undesirably high localized stress at any point.

While the gas pressure is maintained, the assembly is heated to a temperature sufficient to activate the bonding material in spots 72, and form metallurgical bonds 104 (FIG. 14) between the tip ends of the leads and the contacts 90 of the wafer 86. Preferably, the heating process brings the assembly to a temperature of about 240° C. for about 150 seconds. The tin within each spot 72 interdiffuses with the surrounding gold in the contacts 90 and in the lead itself, forming a liquid layer. This layer in turn continues to dissolve gold from the contact pads 90 and from the lead tip ends 68. With increasing gold content, the solidus temperature of the composition rises. At this point, the bond solidifies. The bonding process continues with an annealing step at a temperature sufficient to permit substantial interdiffusion between gold and tin, typically about 180° C. for about 10 minutes, so as to further enrich the bond with gold and further strengthen the bond. During this entire process, the tip ends 68 of the lead remain connected to the lower surface 37 of the dielectric sheet 34 by buttons 80. Thus, the tip ends cannot move out of position during the bonding process.

As wafer 86 and connecting component 84 are heated during the bonding process, the dielectric sheet 34 and potential plane layer 48 tend to expand at a rate greater than the rate of expansion of the wafer. However, because the dielectric sheet and potential plane are held under tension by frame 32, the thermal expansion of the dielectric sheet and potential plane layer are substantially taken up in relieving the tensile stress. The actual movement of features on sheet 34 and layer 48 due to thermal expansion is approximately equal to the thermal expansion of frame 32. Frame 32, in turn, has a coefficient of thermal expansion substantially equal to that of wafer 86. Therefore, the features of component 84 remain in alignment with the features of the wafer during the heating process.

Figure 8:
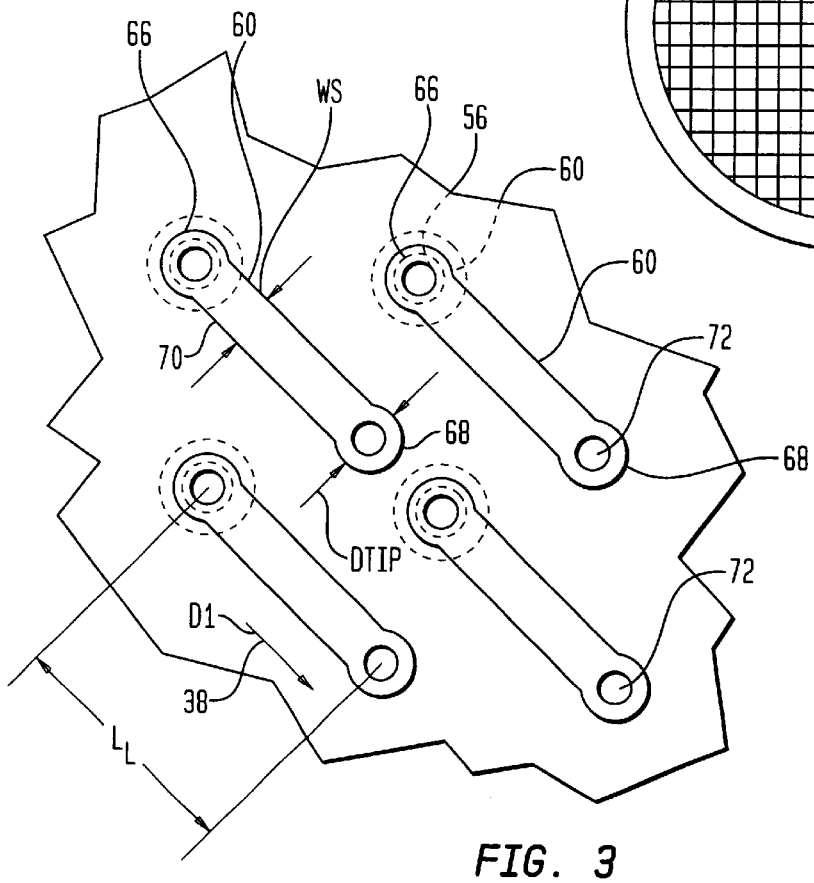
FIG. 8 is a fragmentary bottom plan view depicting portions of the elements shown in FIGS. 1–7.
Figure 14:
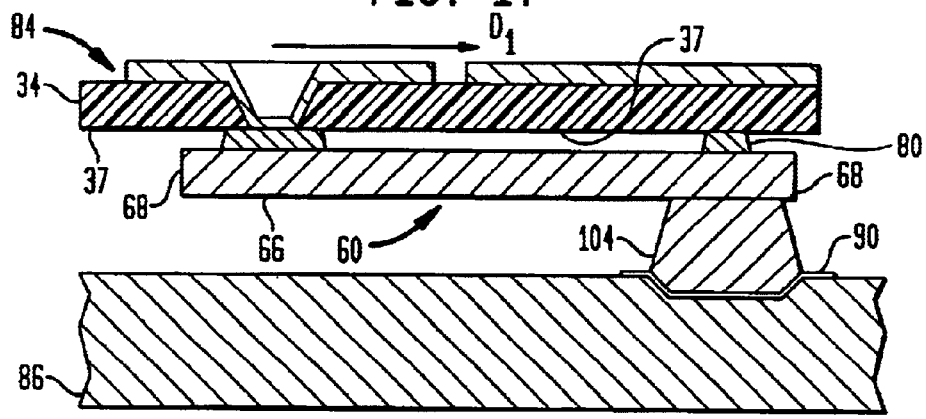

At this stage of the process, in the condition illustrated in FIG. 14, each lead 60 has its terminal end 66 securely bonded to a first element of the assembly, i.e., dielectric sheet 34 and has its second end 68 securely bonded to a second element of the assembly, namely, wafer 86. The tip end 68 of each lead is offset from the terminal end 66 of the lead in a first horizontal direction parallel to the bottom surface 37 of sheet 34, i.e., the direction $D_1$ from left to right as seen in FIG. 14. The same direction $D_1$ is also indicated in the bottom plan view of the leads (FIG. 8). $D_1$ is uniform over the entire component. That is, all of the tip ends are offset from their respective terminal ends in the same direction.

Figure 15:
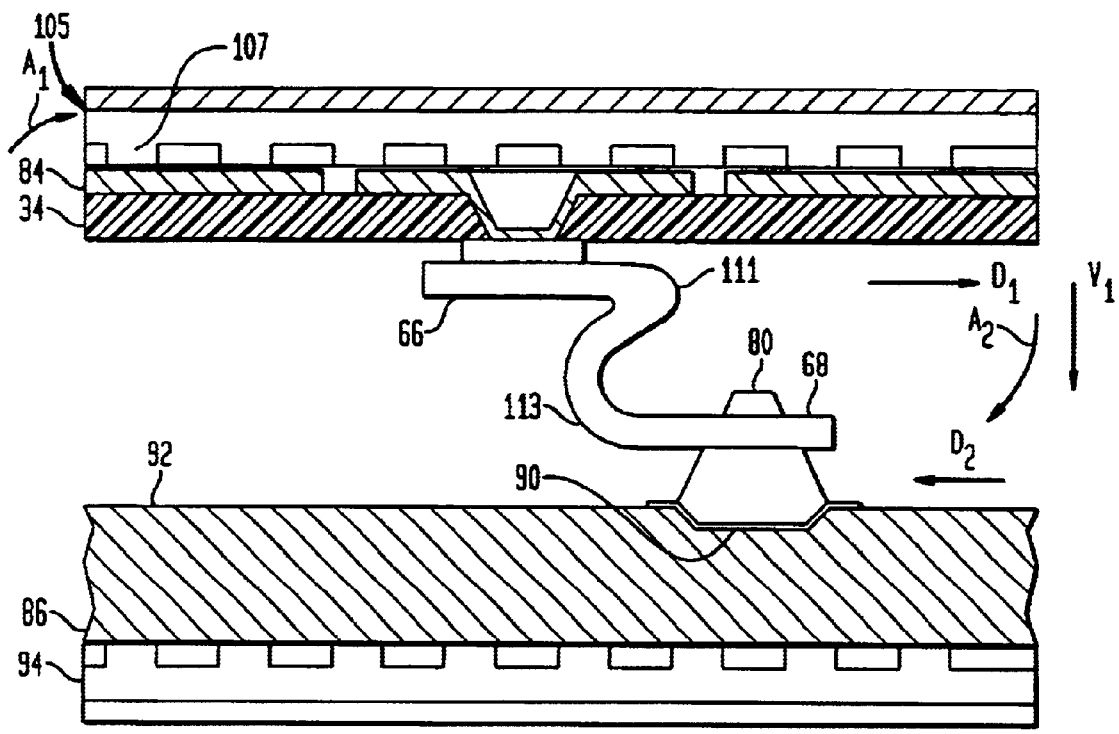
Figure 16:
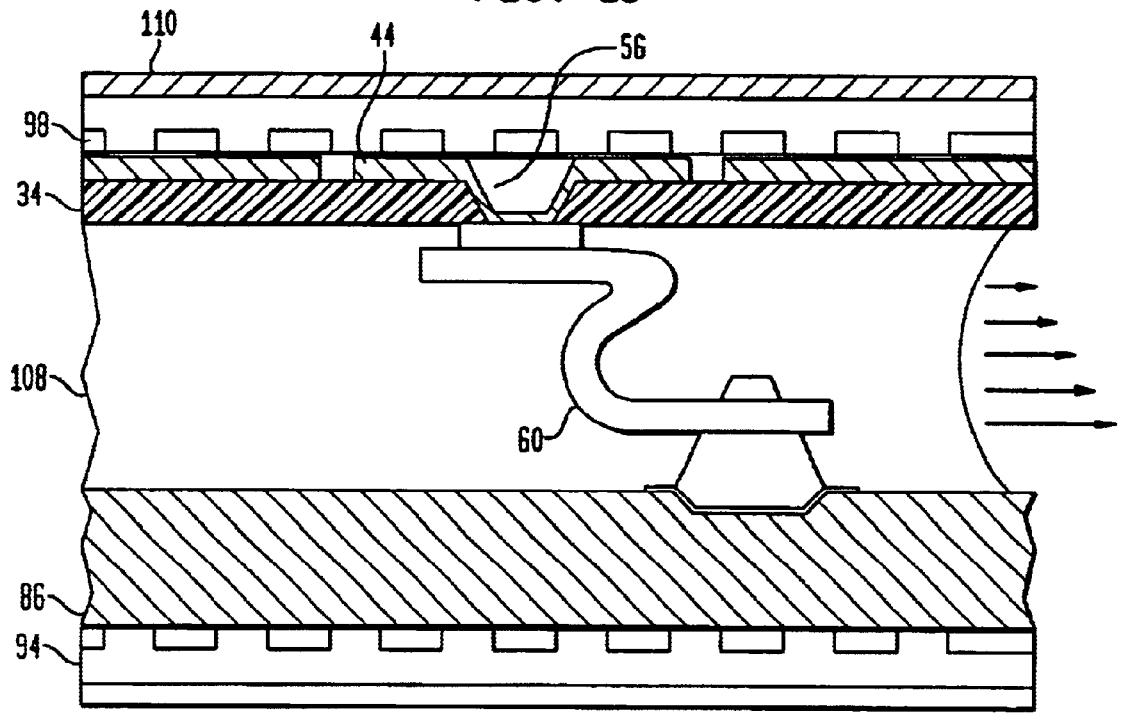

In the next stage of the process, platen 98 is removed and replaced by a metallic vacuum platen 105 having holes 107 extending through it. Vacuum is again applied through platens 105 and 94, thereby holding connecting component 84 including dielectric sheet 34 and the wafer 86 firmly against the platens. The platens are then moved relative to one another by moving one or both of the platens so that platen 94 and hence the chip or second element 86 moves vertically, away from platen 105 and away from the dielectric sheet or first element 34, in the direction indicated by the arrow $V_1$. At the same time, platen 94 and the wafer or second element 86 are moved horizontally relative to platen 105 and the sheet or first element 34 in a horizontal direction $D_2$, to the left as seen in FIG. 15. Stated another way, the horizontal component of motion of the second element or wafer 86, contacts 94 and tip ends 68 bonded thereto is in a second direction $D_2$, opposite to the first or original offset direction $D_1$. Thus, the second element 86 and the tip ends 68 of the leads describe an arcuate path $A_2$ relative to the first element or sheet 34 and relative to the terminal ends 66 of the leads. The vertical movement typically is about 100–500 microns, and the horizontal movement is approximately equal to the vertical movement.

The same motion can be restated in terms of a description of the movement of the first element or sheet 34 and terminal ends 66 relative to the second element or wafer 86 and tip ends 68. In that alternative frame of reference, the first element moves horizontally relative to the second element in the original offset direction $D_1$ and simultaneously moves vertically away from the second element, so that the first element describes an arcuate path $A_1$ relative to the second element. However described, the net effect of the relative movement of the two elements is to move the tip end 68 of each lead horizontally towards the terminal end 66 of the same lead and vertically away from the terminal end of the lead, thus forming each lead into a vertically extensive, generally S-shaped and curved structure as illustrated in FIG. 15.

The S-shaped lead is bent normal to the original top and bottom surfaces of the ribbon or strip 70 constituting lead 60. That is, the curvature of the strip in directions normal to the major surfaces of the ribbon, i.e., the original top and bottom surfaces of the ribbon. Also, as seen in FIG. 15, each S-shaped structure includes a first bight 111 adjacent the terminal end 66 of the lead and hence adjacent the first element or connector body 34 and a second bight 113 adjacent the tip end of the lead and hence adjacent the contact 94 and the second element or wafer 86. Bight 113 is curved in the opposite direction from bight 111. Those portions of the leads constituting the tip end 66 and the terminal end 68 remain generally in their original orientations, so that the original top and bottom surfaces or major surfaces of the lead in these regions continue to face upwardly and downwardly. Although only a single lead is depicted in FIG. 15, it should be appreciated that all of the leads are formed simultaneously in the same manner during the lead-forming process. Thus, all of the leads have the same S-shaped curvature and all of the S-leads extend parallel to one another, in the same orientation.

During the lead-forming process, the tip ends 68 are detached from the bottom surface 37 of the dielectric sheet.

The copper buttons 80 release readily. The force required to deform all of the leads is applied by the atmospheric pressure between the bottom surface 37 of sheet 34 and the top surface 92 of wafer 86. Although the force required for bending each lead will vary with the exact dimensions of the leads, a reasonable value for estimating the forces required is about 2 g per lead. The force available from atmospheric pressure is simply the product of standard atmospheric pressure and the area of the wafer or component. Where the available force from atmospheric pressure is not sufficient, the wafer 86 and the sheet 34 can be temporarily bonded to the platens by temporary bonding agents such as a wax. Alternatively, where appropriate gasketing is arranged around the periphery of the platens, a gas or other fluid under superatmospheric pressure may be introduced between sheet 34 and wafer 86 to increase the forces engaging these elements with the platens and thereby increase the force available to bend the leads.

After the lead-forming step, while the dielectric sheet 34 and wafer . 86 are still in their moved positions, and still engaged with the platens 105 and 94, a flowable, curable dielectric material 108 is injected into the space between the dielectric sheet 34 and the wafer. The bottom surface 37 of the connector body or dielectric sheet 34 is substantially free of perforations other than the perforations occupied by the terminal structures, such as via liners 56. Therefore, the flowable material is constrained between the connector body of dielectric sheet 34 and wafer 86, and does not cover the terminal features 44 on the top surface of the dielectric sheet. Preferably, the flowable material in its uncured condition has a very low viscosity, and also tends to wet the materials of the sheet and wafer so that it effectively fills all of the spaces between the sheet and wafer, penetrating between all of the leads 60. Dielectric material 108 is selected so that it will form a compliant material such as an elastomer upon cure. Suitable materials include curable silicone such as that sold under the trademark DOW 577 SILICONE by the Dow Corning Corporation of Midland, Mich. and other curable silicones available from Shin-Etsu Silicones of America, Inc. The flowable material may be injected under external pressure or else may be injected without external pressure and allowed to fill the space only by capillary action. After injecting the flowable material, the same is cured in place. Depending upon the formulation of the flowable material, such curing may take place spontaneously at room temperature or else may require exposure to heat or radiant energy. A typical cure cycle for the aforementioned silicone materials requires about 160° C. for about 20 minutes.

Figure 17:
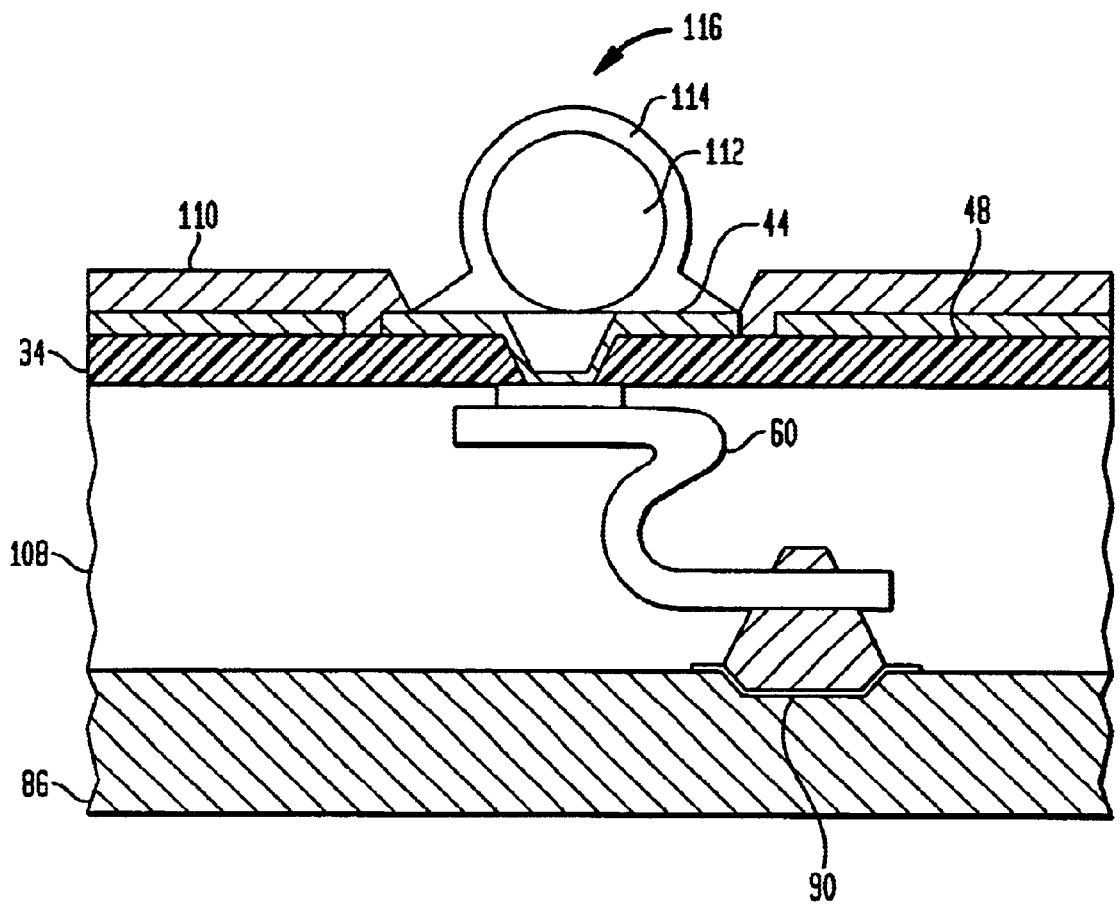

After curing, the assembly including the dielectric top sheet 34, compliant dielectric layer 108 and wafer 86, together with the terminals 44 connected to contacts 94 by leads 60, is removed from the platens. The continuous potential plane layer 48 on the top surface of sheet 34 is then coated with a conventional solder mask layer 110, leaving openings at the terminals 44. Solder balls 116 are then attached on terminals 44 using a solder ball application technique similar to that applied in conventional flip chip bonding. Each solder ball 116 may include a spherical core 112 desirably formed from a copper or copper alloy and a coating 114 of a solder such as a lead-tin solder. For example, the solder balls may include a 200 micron diameter spherical core 112 with a 50 micron thick layer 112 of 63 percent lead −37 percent tin solder. A molybdenum sheet (not shown) having holes in a pattern corresponding to the pattern of terminals 44 is applied in registration with the terminals and solder balls are positioned in the holes of the sheet. Each ball is thus aligned with one terminal 44, and an appropriate flux is applied. The entire assembly is heated to a temperature sufficient to melt the solder, as, for example, about 220° C. for about 40 seconds. The solder flows and bonds to the terminals 35 as illustrated in FIGS. 17. The flux used in soldering is then cleaned from the assembly.

Figure 18:
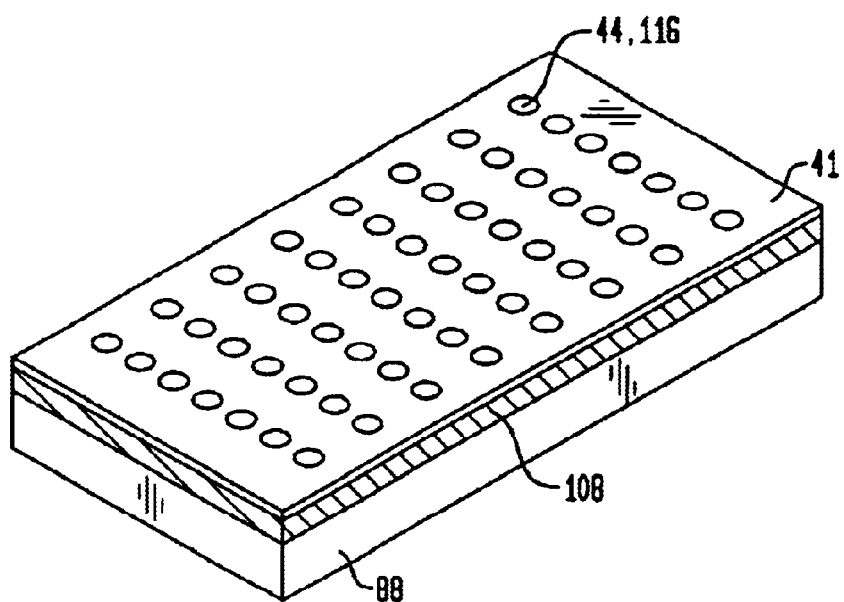
FIG. 18 is a perspective view depicting the completed assembly.

Following the soldering operation, wafer 86, dielectric sheet 34 and the compliant layer 108 are simultaneously severed by sawing along lines 43 (FIG. 12) between the various regions of the dielectric sheet. These lines are in registration with the lines of demarcation between the chips 88 constituting wafer 86. The severing operation thus yields individual units as depicted in FIG. 18, each incorporating one region 41 of the dielectric sheet 34, a portion of layer 108 and one chip 88 of the wafer 86. The terminals and solder balls 44 and 116 on each region are disposed in a grid having pitch substantially equal to the pitch of the contacts on the chip. The entire unit has surface area, in the horizontal plane, no larger than that of the chip itself. Each unit can then be tested individually by engaging the terminals and solder balls of the entire unit simultaneously with temporary contacts or probes on a test fixture, as by engaging the test fixture and the unit with one another under pressure. The compliance of the dielectric material and flexure of sheet 34 and 108 aid reliable, simultaneous engagement with the test fixture. The same procedure can be used for prolonged test operation, commonly referred to as "burn-in".

After testing and burn-in, if required, the unit may be permanently mounted to a substrate such as a circuit panel or chip package by engaging the solder balls with contact pads on the substrate and heating the assemblage to reflow the solder. The soldering techniques per se may be similar to those used in soldering flip-chip or surface mount assemblies. For example, each of the solder balls on the unit may be positioned on a pad of solder paste comprising solder particles dispersed in flux, as commonly used in surface mount attachments. Because the unit is as compact as the original chip, it may be placed close to other chips to form a very compact circuit assembly. After assembly, the unit provides substantial advantages in operation. Thus, the flexible leads 60, flexible sheet 34 and flexible, compliant material 108 permit each terminal 44 and the associated solder ball 116 to move relative to the associated terminal 94 of the chip. This flexibility allows for differential thermal expansion and contraction of the chip and the associated circuit panel or substrate without applying appreciable stresses to the solder joints.

Figure 19:
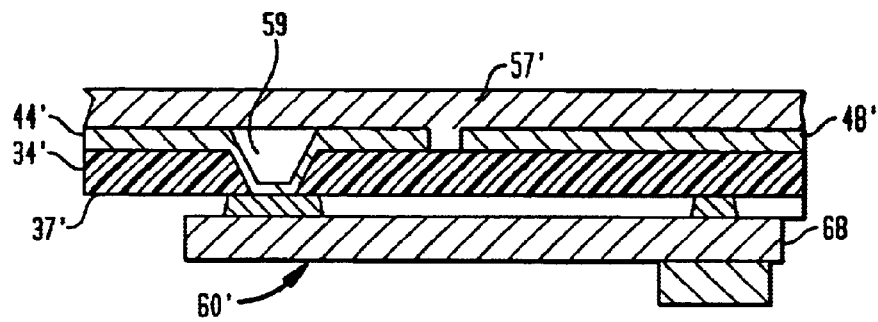
FIG. 19 is a fragmentary sectional view similar to FIG. 10 but depicting a component in accordance with another embodiment of the invention.

A connection component according to a further embodiment of the invention has a structure similar to that described above but incorporates a reinforcing sheet 57 (FIG. 19) overlying the dielectric sheet 34 and hence overlying the terminals 44' and potential plane layer 48' on the top surface of the dielectric sheet. The reinforcing layer extends over the entire surface of the dielectric sheet. Both the dielectric sheet and the reinforcing layer desirably are fastened to a ring-like frame (not shown) similar to the ring-like frame 32 discussed above with reference to FIG. 1. Reinforcing layer 57 desirably is installed after formation of the features on the top surface, such as the terminals 44, layer 48 and associated vias and via liners. Layer 57 may be bonded to the dielectric sheet and to the other structures thereon by a releasable adhesive. The reinforcing layer may be installed before formation of leads 60' and associated features on the bottom surface 37' of the sheet. Preferably, the reinforcing layer has a coefficient of thermal expansion substantially equal to that of the wafer. Molybdenum is a preferred reinforcing sheet material for use with silicon wafers. The reinforcing layer desirably is in the form of a relatively thin sheet or foil, preferably between about 25 microns and about 250 microns thick. During assembly of the connection component to the wafer, fluid pressure is applied on the reinforcing layer and hence applied to the dielectric sheet 34' through the reinforcing layer. The reinforcing layer resists stretching and distortion of the dielectric sheet and thus aids in maintaining precise registration between the tip ends of the leads and the contacts on the wafer. The reinforcing layer may also be provided with apertures (not shown) at the areas where the sheet has fiducial marks, so that the fiducial marks can be seen. The reinforcing layer is removed after assembly to the wafer, as by deactivating heating to deactivate the adhesive. In a variant of this approach, the reinforcing layer may be provided as a permanent layer embedded within the dielectric layer. Such a permanent layer has apertures in alignment with the terminals so that the vias extend through the apertures.

In further variants of the invention, the connection component can be fabricated with a lesser number of regions, and can be applied to only a part of a wafer. Also chips may be severed from the wafer to provide individual chips prior to bonding with the component. Thus, the step of bonding the tip ends of the leads may be performed with one chip at a time. In such an arrangement, the connection components can be fabricated as individual units, each having one chip-size region of the dielectric sheet and each including the leads required to make the connections on a single chip. These individual components may be entirely separate from one another or else may be provided as a semicontinuous tape or sheet for sequential bonding with individual chips. In any such arrangement, the individual chip and the individual portion of the dielectric film are moved relative to one another in the manner described above so as to the form the leads after bonding. Processing the entire wafer simultaneously offer significant economies in processing and simplicity. Only one severing operation is required to sever both the dielectric sheets and the wafer to form the units. However, processing single-chip-size units or small multi-chip units facilitates registration of the tip ends of the leads with the contacts on the chip, and minimizes losses in the event of difficulties during the process.

In other variants according to the present invention, microelectronic components other than semiconductor wafers or chips can be attached to the connection component and used in the lead-forming process. For example, circuit panels or modules having contacts thereon can be attached to the connection component in substantially the same way as the wafers and chips discussed above.

Figure 20:
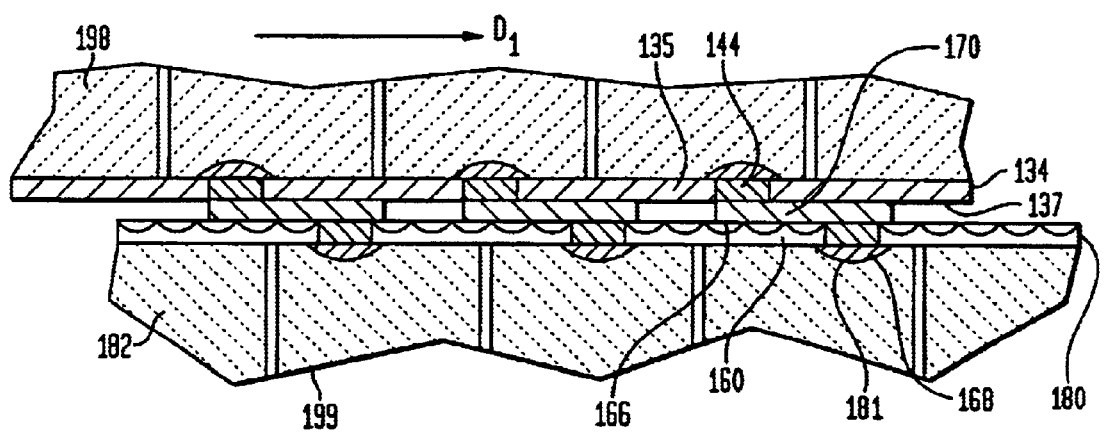
FIGS. 20 through 22 are fragmentary, sectional views depicting a component and process in accordance with further embodiments of the invention.

A connection component according to a further variant is illustrated in FIG. 20. The structure according to this variant includes a dielectric sheet 134 with terminals 144 on a top surface 135 of the sheet. Leads 160 including elongated strip-like structures 170 extend beneath the bottom surface 137 of the dielectric sheet. Each lead includes a terminal end 166 with a terminal end structure extending through the dielectric sheet 134, from the bottom surface to the top surface and merging with the associated terminal 144. These elements may be similar to those discussed above with reference to FIGS. 1–19. For example, each strip-like lead section 170 may be spaced apart from dielectric sheet 134 and may be attached to the dielectric sheet only by the terminal end structure and by a point attachment at the tip end 168 of the lead.

The component of FIG. 20 further includes a positioner sheet 180 formed from a soluble sheet-like material such as a styrene polymer or copolymer. Each lead has a tip end structure 181 such as a blind via extending through positioner sheet 180 and terminating in an outwardly flaring head on the bottom side 182 of the positioner sheet, i.e., on the side of the positioner sheet remote from the leads and remote from dielectric or top sheet 134. Here again, in the initial, undeformed condition illustrated in FIG. 20, the tip end 168 of each lead is offset from the terminal end 161 in a first horizontal direction $D_1$.

Figure 21:
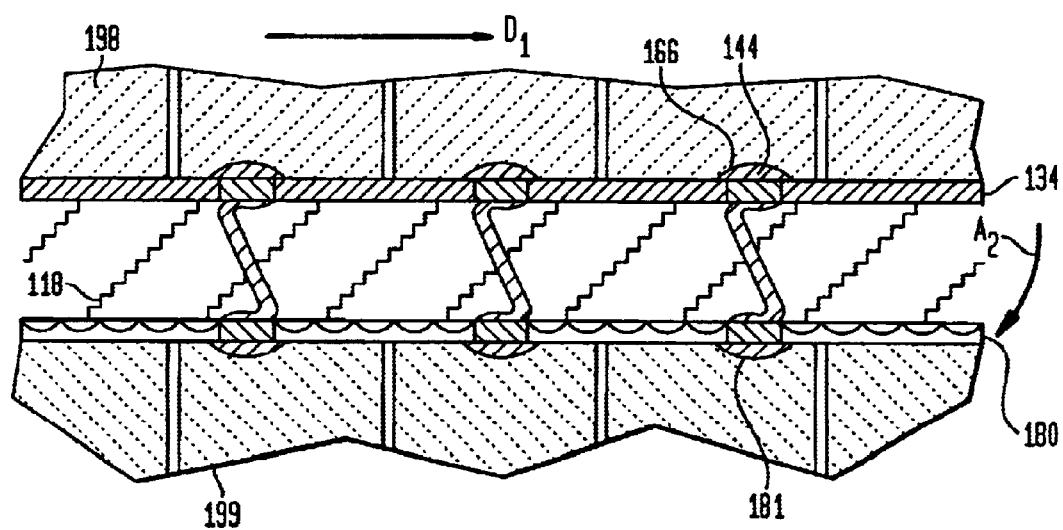

In a forming process, dielectric sheet 134 and positioner sheet 180 are engaged with platens 198 and 199 respectively. The platens are moved relative to one another so that platen 199, positioner sheet 180 and hence the tip ends 168 of the leads move relative to the dielectric sheet 134 and the terminal ends 166 of the leads in an arcuate motion to the position illustrated in FIG. 21. The positioner sheet and hence the tip ends of the leads move relative to the terminal ends of the leads in a second horizontal direction opposite to first direction $D_1$ and also move vertically downwardly, away from the dielectric sheet 134 and the terminal ends 166. Again, each tip end moves horizontally towards the associated terminal end but vertically away from the terminal end, so that the leads are deformed to a vertically extensive S-shaped, curved condition. Here again, all of the S-shaped leads are curved normal to the major surfaces of the ribbons 160 constituting the leads. Also, the S-shaped leads extend parallel to one another.

Figure 22:
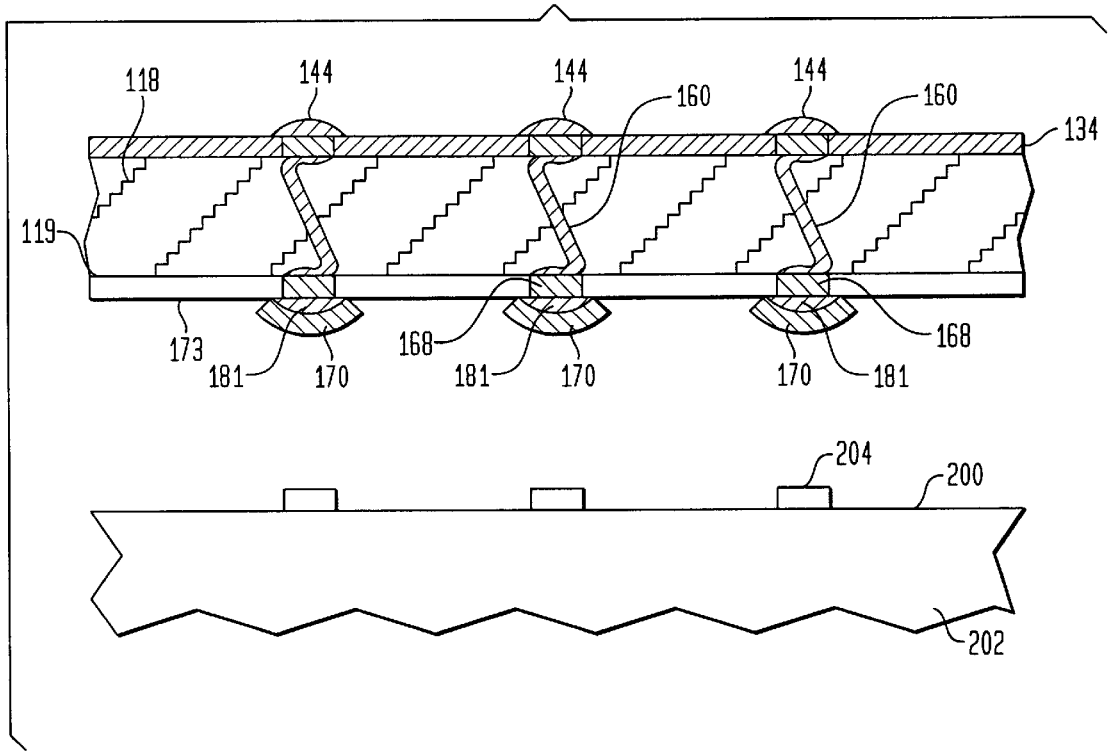

Following this operation, a flowable, curable dielectric material 118 is introduced between the sheets 134 and 180 and cured in substantially the same way as discussed above, whereupon the component is removed from the platens. As illustrated in FIG. 22, positioner sheet 180 is removed, preferably by exposure to a solvent, leaving the bottom surface 119 of the dielectric layer exposed. In this condition, the dielectric support layer 118 surrounds and supports the leads 160. Each of the tip end structures 181 is exposed at the bottom surface of the dielectric support layer. An electrically conductive bonding material 170 is applied on the tip end structures 181 and a layer of a curable, dielectric adhesive 173 is applied over the bottom surface 118 of the dielectric support layer 119. The adhesive may be a so-called snap-cure adhesive having an activation temperature above room temperature but below the temperatures which would be damaging to other components of the assembly. One suitable solvent-free, snap-cure adhesive is sold under the trademark ABLEBOND 967-3 by the Ablestick Electronics Materials and Adhesives Company of Rancho Dominguez, Calif. Conductive bonding material 170 may be a eutectic bonding material as discussed above, and may be provided with a thin layer of gold to inhibit oxidation. The connection component is now ready for use.

In use, the bottom surface 119 of the dielectric support layer is juxtaposed with the contact-bearing surface 200 of a semiconductor chip, wafer or other microelectronic element 202, so that the tip ends 168 of the leads, and hence the tip structures 181 and conductive bonding materials 170 are in registration with contacts 204 and the assemblage is then subjected to heat and pressure so as to engage the bottom surface of the support layer 118 with the contact-bearing surface 200 and engage the lead tip ends with the contacts. Under these conditions, the adhesive 173 forms a void-free interface between support layer 118 and element 202 and the conductive bonding material forms a metallurgical bond and electrical connection between the leads and the contact of the microelectronic element, thereby connecting the terminals 144 to the contacts. The resulting assembly can be mounted to a circuit panel or other substrate in the same manner as the assemblies discussed above and provides similar advantages. Here again, the connection component can be fabricated as a large component for simultaneous attachment to all of the chips in a single wafer, followed by severance of the chips from the wafer and portions of the dielectric sheet from one another so as to form individual units. Alternatively, the connection component can be fabricated in a single-chip size, and attached to a single chip after severance of the chip from the wafer.

In a further variant, positioner sheet 180 may be left in place as a part of the final component. In this case, the positioner sheet 180 preferably is formed from a flexible dielectric material similar to that used for top sheet 134. The positioner sheet may be provided with a coating of adhesive on its bottom surface so as to promote formation of a void-free interface between the positioner sheet and the chip or other microelectronic component. In a further variant, the first element bearing the terminal ends of the leads may itself be a thick, rigid substrate, with internal conductors connected to the terminal ends of the leads. In such an arrangement, the microelectronic element or chip is connected directly to the substrate through the leads, and the microelectronic element is moved relative to the substrate in the lead framing forming step. In the structures and methods discussed above, the flowable dielectric material used to form a compliant layer between the dielectric sheet or connector body and the tip or microelectronic element can be omitted. This leaves the dielectric sheet or connector body resiliently supported above the chip or microelectronic element by the leads themselves.

According to a further variant, the second element used to move the tip ends of the leads may be a tool, such as a platen-like structure, temporarily engaged with or bonded to the tip ends. Such tool may be disengaged from the tip ends after the lead moving step.

The terminals on the component need not be attached to a substrate by soldering. Other methods, such as eutectic bonding, diffusion bonding, and physical engagement of the terminals with contact pads, socket elements or the like can be used. The configuration of the terminals may be varied to suit these methods. Eutectic bonding materials other than the preferred gold-tin compositions can be employed. Thus, gold can form eutectic compositions with germanium, silicon, tin or combinations thereof. The tip ends of the leads can be attached to contacts on the wafer or other microelectronic component by methods other than eutectic bonding as, for example, by diffusion bonding without formation of a liquid phase or by using a solder or metal-bearing polymeric composition. Bonding materials can be applied by methods other than plating as, for example, by dipping the lead tip ends, by silk screening, or by application of a paste. The conductive bonding material may be provided on the contacts of the microelectronic element, rather than on the lead tip ends. Alternatively, bonding methods which do not require a distinct bonding material may be employed. Examples of such bonding methods are such as thermosonic and thermocompression bonding of the lead tip ends to the contacts. Materials other than gold, such as silver, copper and brass may be employed for the leads. Metals other than copper and nickel can be used in the terminals, conductive layer and via liners.

Figure 23:
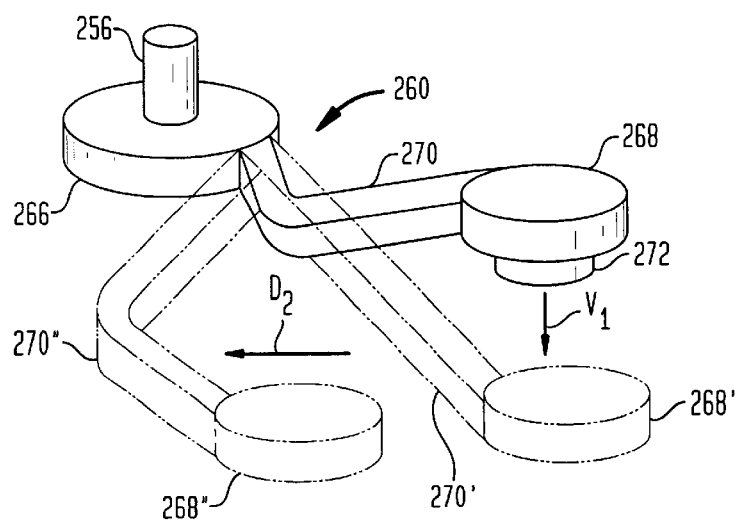
FIG. 23 is a fragmentary, diagrammatic perspective view illustrating operation of a component in accordance with a further embodiment of the invention.

As illustrated in FIG. 23, each lead 260 may have a terminal end 266 attached to a terminal structure 256 protruding upwardly through the dielectric sheet or connector body (not shown) and may also have a tip end 268 having bonding material 272 or other suitable provision for bonding the tip end to a contact. These elements may be similar to the corresponding elements of the structures discussed above. The structure of FIG. 23 includes a curved strip 270 connecting the tip end 268 and the terminal end 266 of the lead. In the initial, undeformed condition of the lead shown in solid lines in FIG. 23, the tip end, terminal end and strip 270 are all substantially coplanar, and lie at or close to the bottom surface of the connector body. Using a connection process similar to that discussed above with reference to FIGS. 13–15, the tip ends 268 are bonded to contacts on a microelectronic element such as a wafer, chip or the like.

After bonding, the microelectronic element is then moved, relative to the connector body or dielectric sheet, and hence relative to the terminal ends 266 of the leads, in a downward, straight-line vertical motion. This causes the terminal ends 268 to move in a similar unidirectional vertical motion downwardly away from the first element or dielectric sheet. The direction of relative motion is indicated by the arrow $V_1'$ in FIG. 23. The downward displacement of the tip end tends to straighten the initially curved strip 270 as schematically indicated in broken lines at 270'. Thus, after the movement, the leads are straighter than the S-shaped leads discussed above. Most preferably however, the leads do not become entirely straight during the movement process, so that the leads do not tend to pull the tip ends and terminal ends away from the sheet or microelectronic element. Processes using initially curved strips can also incorporate the compound motion as discussed above with reference to FIG. 15. Thus, with the curved strip 270 as well, if the relative motion includes a movement of the second element and tip ends 268 in the horizontal direction $D_2'$ towards the terminal ends 266, the curved strip 270 can be formed into a curved shape 270".

Figure 24:
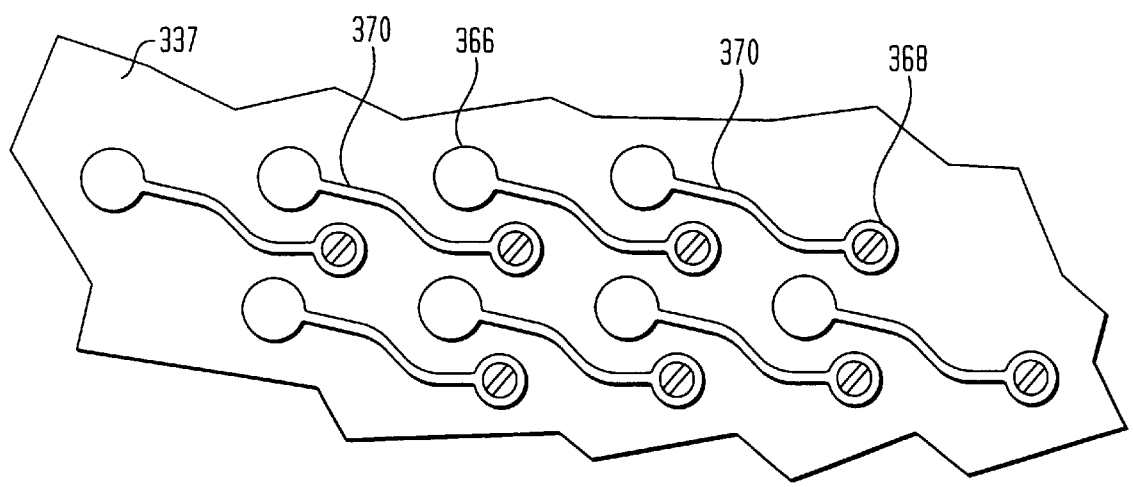
FIGS. 24 through 27 are fragmentary, diagrammatic plan views depicting components in accordance with a further embodiment of the invention.
Figure 25:
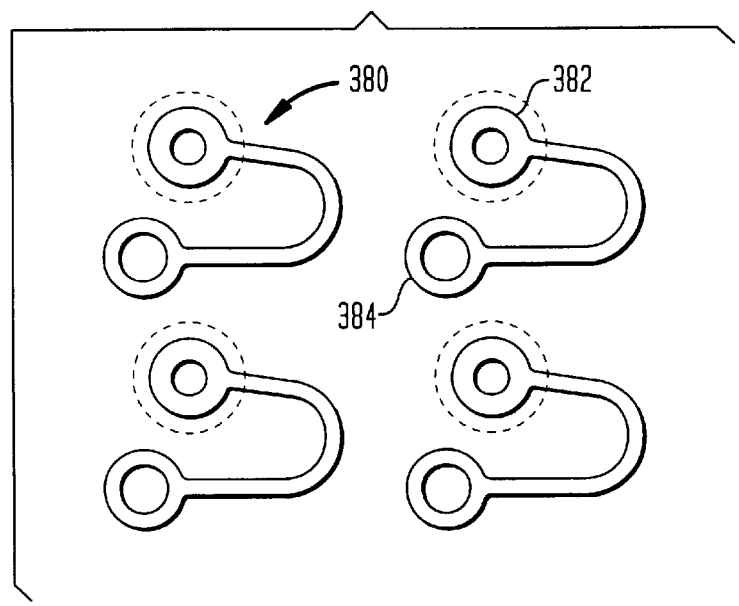

The initially curved leads may be arranged in different ways on the connector body or dielectric sheet. For example, each curved lead, in its initial, undeformed state, may include an S-shaped strip 370 extending along the bottom surface 337 of the dielectric sheet (FIG. 24) for connector body, between the terminal ends 366 and tip end 368 of each lead. The S-shaped lead structures may be nested in the manner illustrated in FIG. 24, with the terminal ends 366 disposed in rows and the tip ends 368 disposed in similar but offset rows. Alternatively, the curved leads may include generally U-shaped structures 380 having a single bight between the terminal end 382 and tip end 384 of each lead. Structures with plural bights can also be employed.

Figure 26:
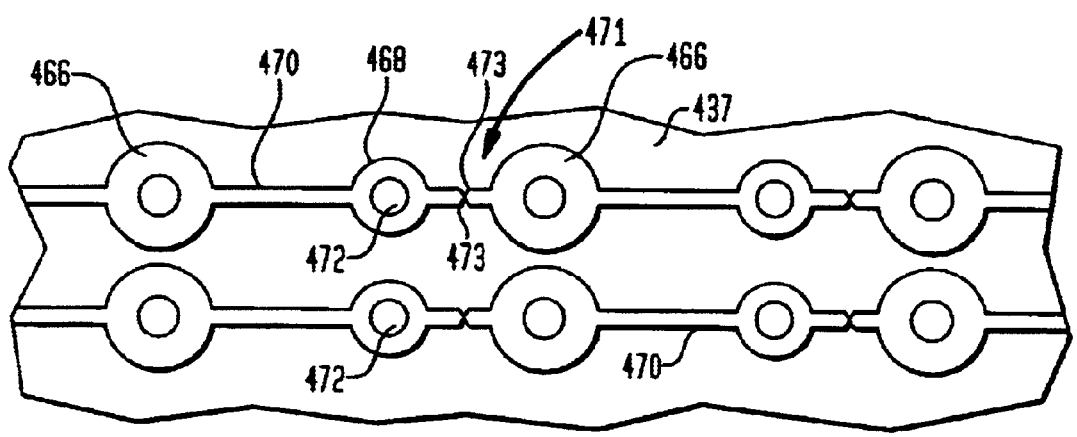

In the component of FIG. 26, the tip end 468 of each lead is not held in position by a button or other bonding structure underlying the tip end. Rather, the tip end of each lead is connected through a frangible element 471 to the terminal end 466 of the next adjacent lead. The frangible element thus retains each tip end 468 in position, adjacent the bottom surface 437 of the connector body or dielectric sheet. Frangible element 471 may be formed as a continuation of the strip 470 constituting the lead itself, with V-shaped notches 473 extending into the strip from opposite sides thereof. In the assembly process, the tip ends 468 are bonded to the contacts of a chip or other microelectronic element in the same manner as discussed above, as by activating electrically conductive bonding material 472 on the tip ends. After bonding, the microelectronic element is moved relative to the connector body or dielectric sheet in the same manner as discussed above, so that the tip end 468 of each lead moves vertically away from the body and away from the terminal ends 466, and so that the tip end 468 also moves towards the associated terminal end 466. This action breaks the frangible element 471 and hence releases each tip end from its connection to the next terminal end. Configurations for frangible leads are disclosed, for example, in PCT Publication WO9403036 published Feb. 3, 1994 (application No. U.S. Ser. No. 93/06930). The disclosure of such PCT Publication, insofar as it describes frangible structures in leads, is hereby incorporated by reference herein.

Figure 27:
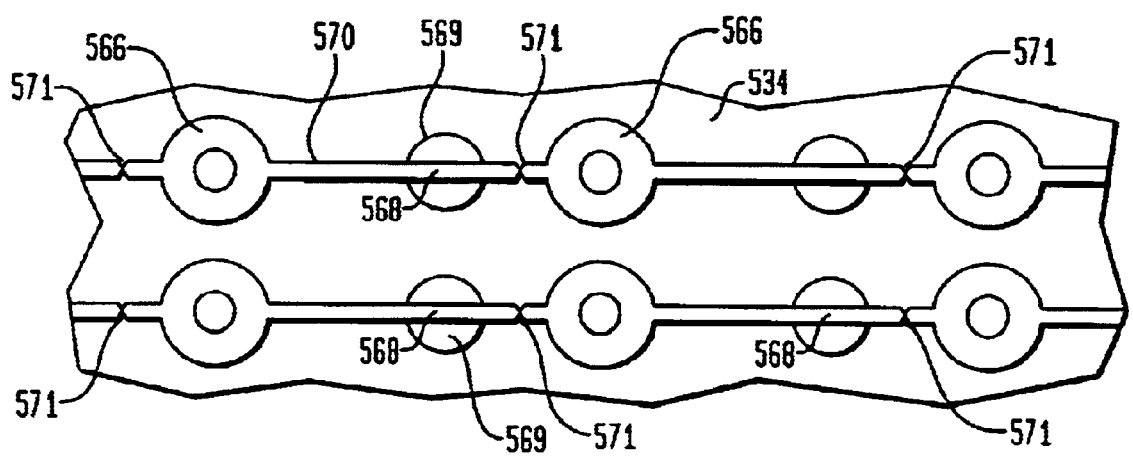
Figure 28:
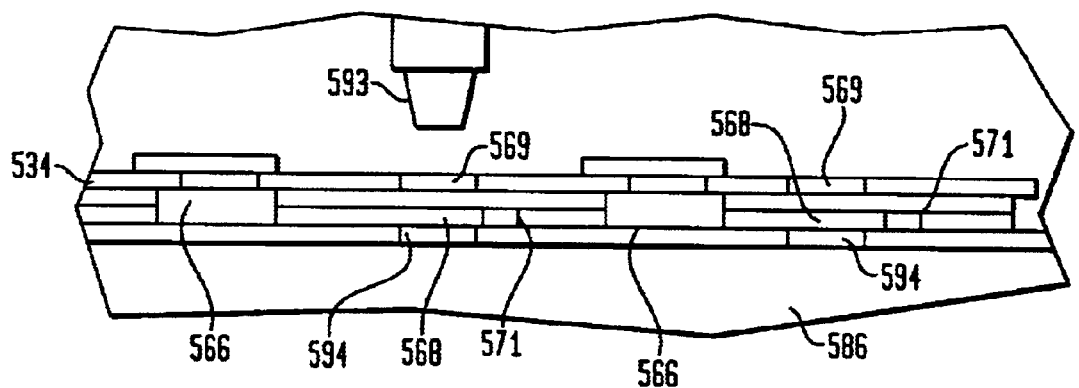
FIG. 28 is a fragmentary, schematic sectional view depicting a portion of an assembly process utilized with the component of FIG. 27.

In the component of FIG. 27, the terminal end 568 of each lead is not provided with a bulge, but instead constitutes a continuation of the strip 570 forming the lead. The tip end 568 of the lead is again connected to the terminal end 566 of the next adjacent lead by a frangible section 571. In this component, the dielectric sheet or connector body 534 has holes 569 aligned with the terminal ends 568 of the leads. As illustrated in FIG. 28, the bonding procedure used with this component employs a bonding tool 597. After positioning sheet or connector body 534 and the leads thereon in alignment with the contacts 594 on the microelectronic element or chip 586, a tool 597 is advanced through holes 569 and engaged with the tip end 568 of each lead in succession so as to bond the tip ends to the contacts. After such bonding, the microelectronic element or chip 586 is moved relative to the dielectric sheet or connector body 534 in the same manner as discussed above. Once again, this movement breaks the frangible section 571 between the tip end of each lead and the terminal end 566 of the adjacent lead, thus releasing the tip ends and allowing the leads to bend away from the dielectric sheet or connector body 534 in the same manner as described above. Before or after the movement step, holes 569 may be closed by application of a further film or sheet on the top surface of the dielectric layer.

Figure 29:
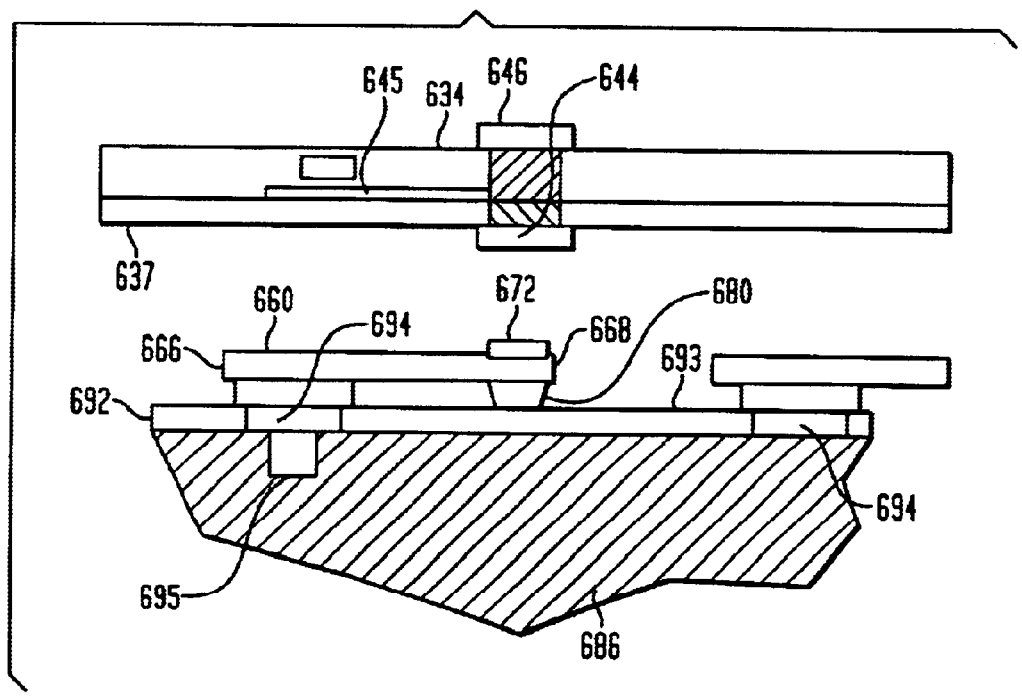
FIG. 29 is a fragmentary, diagrammatic, sectional view depicting components according to a further embodiment of the invention.

As illustrated in FIG. 29, a wafer, chip or other microelectronic element 686 may itself be provided with leads 660 extending on or over the contact bearing surface 692 of the wafer. Thus, the fixed or terminal end 666 of each lead may be permanently connected to the contacts 694 of the chip or wafer and hence permanently connected to the internal circuitry of the chip or wafer, schematically indicated at 695. The tip end 668 of each lead may be detachably secured to the top surface of the chip or wafer, as by a small, loosely adhering button 680, similar to those discussed above. The tip end may optionally be provided with bonding material 672. Such a structure may be fabricated in substantially the same way as the lead structures discussed above. The contact bearing surface 692 of the chip may be provided with a coating 693 of a polyimide or other dielectric material to protect the chip itself during the lead-forming process. This coating may remain in place in the finished assembly. The lead-bearing chip or wafer of FIG. 29 can be assembled to a connector body 634 having terminal 644 on its bottom surface 637. Each terminal 644 is being connected to internal circuit elements or conductors 645. Each terminal 644 may also be connected to a structure 646 on the top surface of the connector body. Structures 646 are adapted for connection to an external substrate as, for example, by a solder ball process as discussed above. The bonding procedure is substantially the same as that discussed above. Here again, after bonding the two elements are move vertically from one another and desirably also move horizontally, so as to form the desired curved lead structures.

Figure 30:
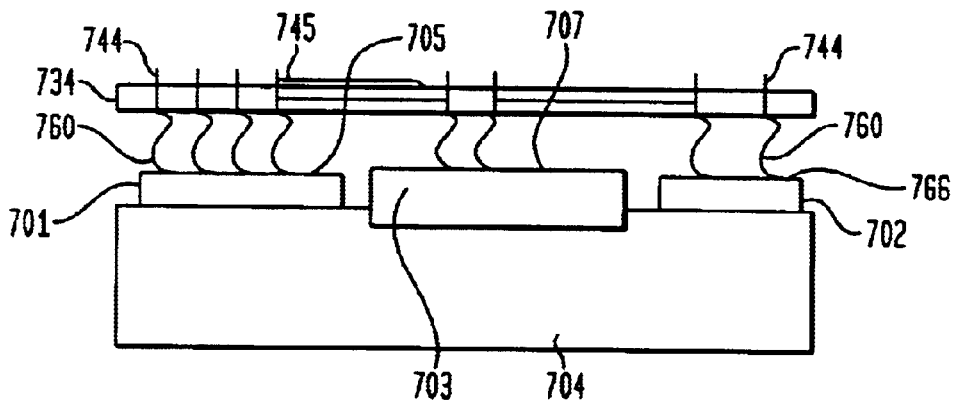
FIG. 30 is a fragmentary, schematic elevational view of an assembly in accordance with yet a further embodiment of the invention.

As illustrated in FIG. 30, an assembly according to a further embodiment of the invention may include a plurality of microelectronic elements such as a plurality of chips 701, 702 and 703. These elements may be physically attached to a common support or heat sink 704 so that the contact bearing surfaces 705, 706 and 707 are disposed generally coplanar with one another. If the chips are of different thicknesses, sink 704 may have chip mounting surfaces at different heights. The microelectronic elements are disposed at preselected horizontal locations relative to one another. That is, the contact arrays of the various chips are disposed at predetermined locations relative to one another. The connector body 734 used with these elements may have numerous terminals 744 thereon. Terminals 744 desirably are disposed in arrays corresponding to the arrays of contacts on the various chips or microelectronic elements. The terminals 644 are also adapted for connection to an external substrate (not shown). Numerous S-shaped leads 760 are formed between the terminal 744 and the contacts on the chips by a process as described above. Thus, connector body 734 may be juxtaposed with the assemblage of chips 701, 702 and 703, and the tip ends of the leads on the connector body may be bonded to the contacts on the plural chips simultaneously, whereupon the assemblage of chips is moved relative to the connector body 734. Alternatively, chips 701, 702 and 703 may themselves have leads thereon as discussed above with reference to FIG. 29, and the tip ends of such leads may be bonded to terminals 744 on the connector body. Here again, a compliant dielectric material (not shown) desirably is injected into the space between the connector body and the chip assemblage, so as to substantially surround the curved leads. In this arrangement, the connector body 734 has conductors 745 interconnecting various terminals 744 and thus interconnecting the various chips or microelectronic elements with one another to form a multichip module. Conductors 745 are represented only schematically in FIG. 30. In actual practice, the conductors may include numerous conductors arranged in multiple layers and may also include conductors on the top and bottom surfaces of the connector body 734 itself In an alternate process, each chip 701, 702 and 703 may be independently aligned with the connector body 734 and bonded to tip ends 768 of the leads 760, before the support or heat sink 704 is bonded to the chips.

The microelectronic elements connected by the structures and methods according to the present invention need not include the chips themselves. For example, the microelectronic element itself may be a circuit panel or interconnection module such as a rigid printed wiring board, a ceramic module or a metal core wiring layer. The leads used to connect elements of this nature typically are larger than the leads used to connect to chips or wafers. Thus, the leads used for direct connection to circuit panels desirably are formed from a ribbon-like structure between about 10 microns and about 35 microns thick and between about 500 microns and about 2500 microns long. For this purpose, the ribbons desirably are formed from copper alloy rather than from gold.

As these and other variations and combinations of the features discussed above can be utilized without departing from the present invention as defined by the claims, the foregoing description of the preferred embodiments should be taken as illustrating, rather than limiting, the invention as claimed.

What is claimed is:

1. A component for making connections comprising:
    (a) a support having top and bottom surfaces and having holes extending between said top and bottom surfaces;
    (b) a plurality of leads extending along a surface of said support, said leads having terminal ends permanently attached to said support and having tip ends aligned with said holes, the tip end of each said lead being releasably connected to the terminal end of another one of said leads.

2. A component as claimed in claim 1, wherein said leads extend along said bottom surface of said support.

3. A component as claimed in claim 1 wherein said leads are arranged in rows, with the tip end of each lead being releasably connected to the terminal end of the next lead in the same row.

4. A component as claimed in claim 1 wherein each said lead has a frangible section connected between the tip end of such lead and the terminal end of another one of said leads.

5. A component as claimed in claim 4 further comprising terminals exposed at said top surface of said support, at least some of said terminals being connected to at least some of said terminal ends of said leads.

6. A component as claimed in claim 1 wherein said support includes a dielectric sheet.

7. A component as claimed in claim 6 wherein said support is a multi-layer sheet.

8. A component as claimed in claim 6 wherein said support includes a polymeric film.

9. A component as claimed in claim 8 wherein said support is comprised of polyimide.

10. A component as claimed in claim 6 wherein said support is flexible.

11. A packaged semiconductor wafer comprising:
    (a) a support having top and bottom surfaces and having holes extending between said top and bottom surfaces;
    (b) a unitary wafer including a plurality of semiconductor chips, each chip having a plurality of associated chip contacts, said wafer being juxtaposed with said support bottom surface so that said chip contacts are aligned with said holes;
    (c) a plurality of terminals on said support, said terminals being exposed at said support top surface; and
    (d) a plurality of leads extending downward from said support to said chip contacts, said leads and said contacts being bonded to one another within said holes, said leads further having terminal ends connected to said terminals.

12. A packaged semiconductor wafer as claimed in claim 11, wherein said leads further include lead portions extending along said support surface from said terminal ends to said holes.

13. A packaged semiconductor wafer as claimed in claim 12, wherein said leads extend along said bottom surface of said support.

14. A packaged semiconductor wafer as claimed in claim 11 wherein said leads are arranged in rows.

15. A packaged semiconductor wafer as claimed in claim 11 wherein said support includes a dielectric sheet.

16. A packaged semiconductor wafer as claimed in claim 15 wherein said support is a multi-layer sheet.

17. A packaged semiconductor wafer as claimed in claim 15 wherein said support includes a polymeric film.

18. A packaged semiconductor wafer as claimed in claim 17 wherein said polymeric film includes polyimide.

19. A packaged semiconductor wafer as claimed in claim 15 wherein said support is flexible.

* * * * *

UNITED STATES PATENT AND TRADEMARK OFFICE
CERTIFICATE OF CORRECTION

PATENT NO. : 6,635,553 B1
DATED : October 21, 2003
INVENTOR(S) : Thomas H. DiStefano and John W. Smith It is certified that error appears in the above-identified patent and that said Letters Patent is hereby corrected as shown below:

<u>Title page,</u>
Item [73], Assignee, "Iessera, inc.," should read -- Tessera, Inc. --.

<u>Column 14,</u>
Line 20, delete the "." after the word "wafer."

Signed and Sealed this

Eleventh Day of May, 2004

JON W. DUDAS
*Acting Director of the United States Patent and Trademark Office*